(12) United States Patent
Schwarz et al.

(10) Patent No.: US 10,388,633 B2
(45) Date of Patent: Aug. 20, 2019

(54) VIDEO WALL MODULE AND METHOD FOR PRODUCING SAME

(71) Applicant: OSRAM Opto Semiconductors GmbH, Regensburg (DE)

(72) Inventors: Thomas Schwarz, Regensburg (DE); Frank Singer, Regenstauf (DE); Christian Leirer, Regensburg (DE)

(73) Assignee: OSRAM Otpo Semiconductors GmbH, Regensburg (DE)

( * ) Notice: Subject to any disclaimer, the term of this patent is extended or adjusted under 35 U.S.C. 154(b) by 0 days.

(21) Appl. No.: 15/743,244

(22) PCT Filed: Jul. 27, 2016

(86) PCT No.: PCT/EP2016/067912
§ 371 (c)(1),
(2) Date: Jan. 9, 2018

(87) PCT Pub. No.: WO2017/017143
PCT Pub. Date: Feb. 2, 2017

(65) Prior Publication Data
US 2018/0204823 A1    Jul. 19, 2018

(30) Foreign Application Priority Data

Jul. 30, 2015    (DE) .................. 10 2015 112 556

(51) Int. Cl.
*H01L 33/52*        (2010.01)
*H01L 33/58*        (2010.01)
(Continued)

(52) U.S. Cl.
CPC .......... *H01L 25/0753* (2013.01); *H01L 33/52* (2013.01); *H01L 33/58* (2013.01);
(Continued)

(58) Field of Classification Search
CPC ..... H01L 25/0753; H01L 33/52; H01L 33/58; H01L 33/62; H01L 2933/005; H01L 2933/0058; H01L 2933/0066
See application file for complete search history.

(56) References Cited

U.S. PATENT DOCUMENTS 4,445,132 A      4/1984  Ichikawa et al.
2010/0258822 A1* 10/2010 Kobayashi .......... H01L 25/0753
                                                     257/88
(Continued)

FOREIGN PATENT DOCUMENTS

EP            2495761 A2    9/2012

*Primary Examiner* — Mark W Tornow
(74) *Attorney, Agent, or Firm* — Slater Matsil, LLP

(57) ABSTRACT

A video wall module and a method for producing a video wall module are disclosed. In embodiments, the video wall module includes a plurality of light emitting diode chips, each light emitting diode chip comprising a top electrode arranged at a top side of the light emitting diode chip, a bottom electrode arranged at a bottom side of the light emitting diode chip and a molded body embedding the light emitting diode chips, a front-side metallization arranged at the front side of the molded body, wherein the top electrodes are connected to the front-side metallization, a rear-side metallization arranged at a rear side of the molded body, wherein the bottom electrodes are connected to the rear-side metallization, a dielectric layer arranged at the rear side of the molded body and an outer metallization arranged at the dielectric layer, wherein the rear-side metallization is electrically conductively connected to the outer metallization.

19 Claims, 20 Drawing Sheets

(51) Int. Cl.
*H01L 33/62* (2010.01)
*H01L 25/075* (2006.01)

(52) U.S. Cl.
CPC ........ *H01L 33/62* (2013.01); *H01L 2933/005* (2013.01); *H01L 2933/0058* (2013.01); *H01L 2933/0066* (2013.01)

(56) References Cited

U.S. PATENT DOCUMENTS

| | | |
|---|---|---|
| 2012/0223345 A1 | 9/2012 | Tomoda et al. |
| 2015/0054008 A1 | 2/2015 | Rhee |

* cited by examiner

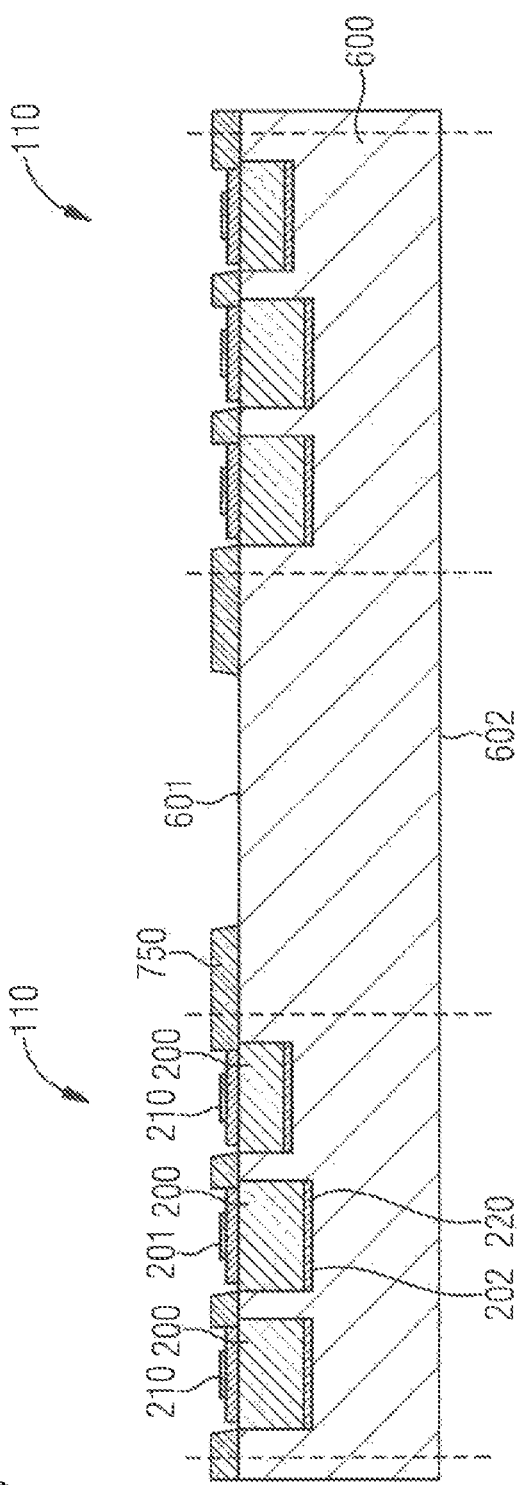
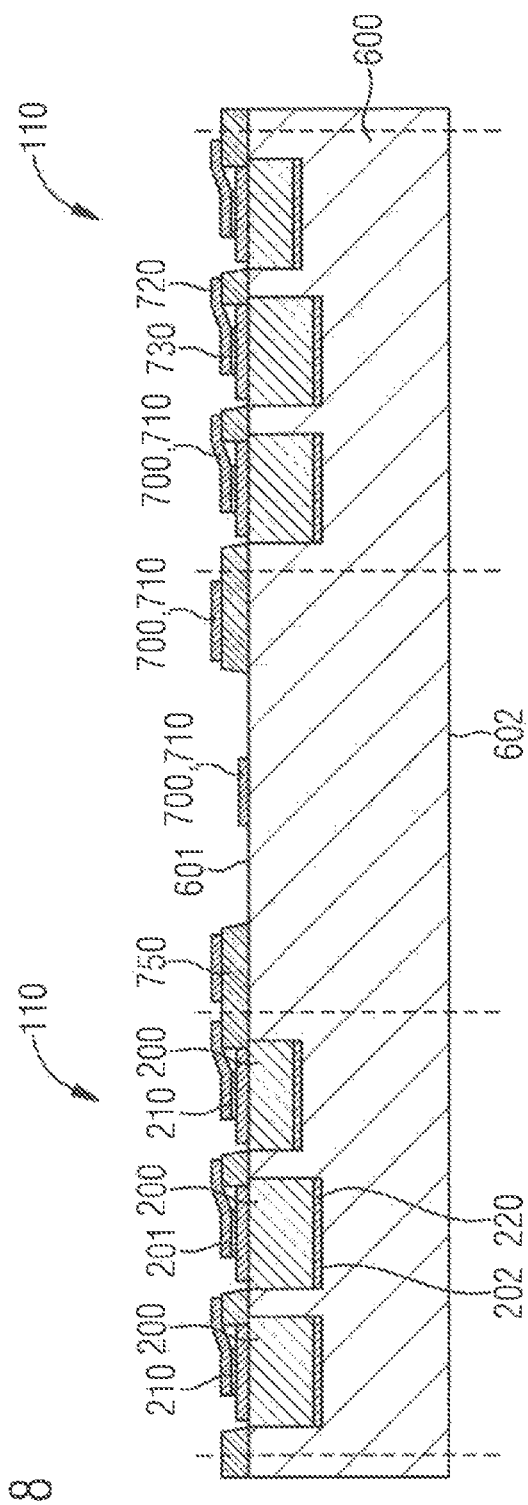

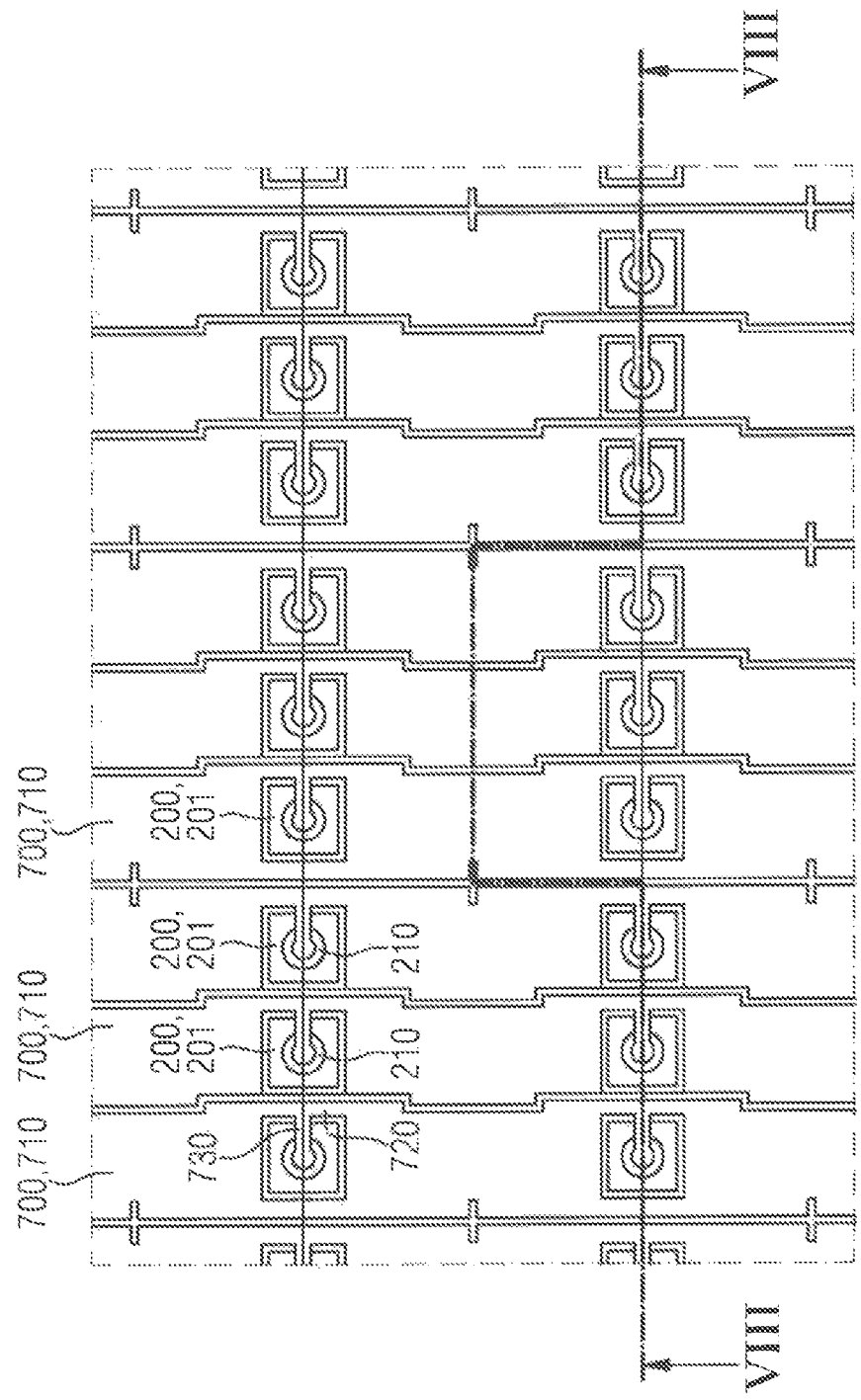

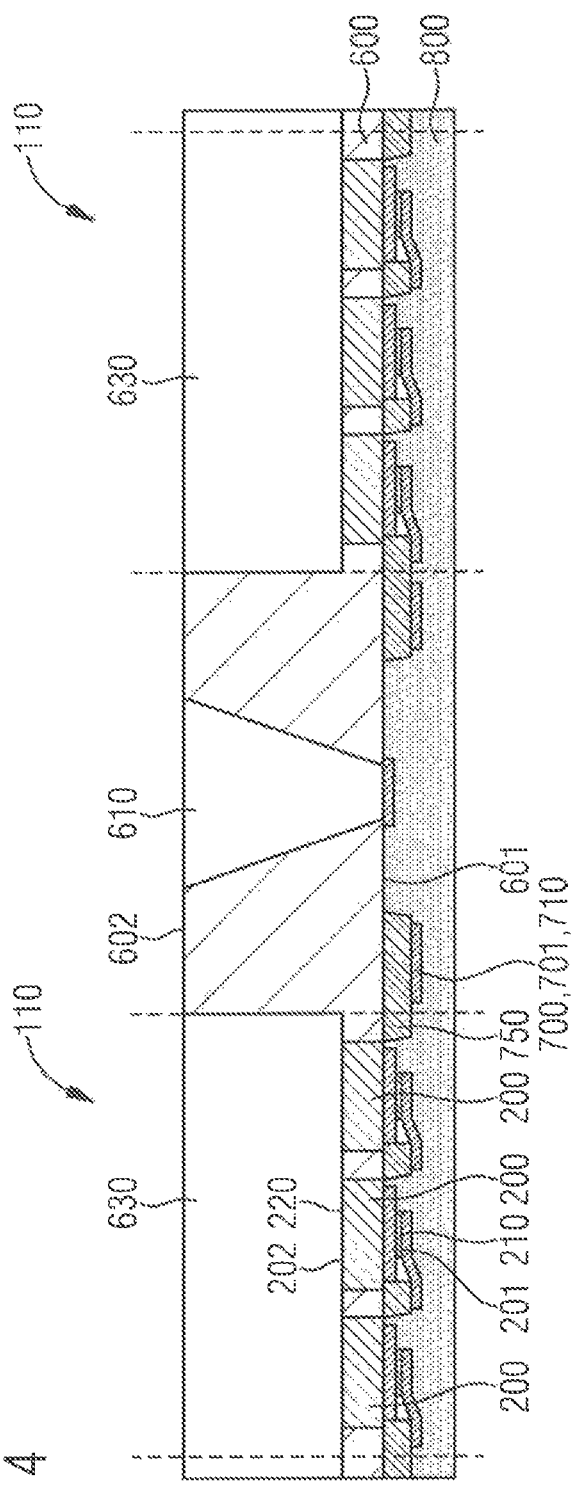

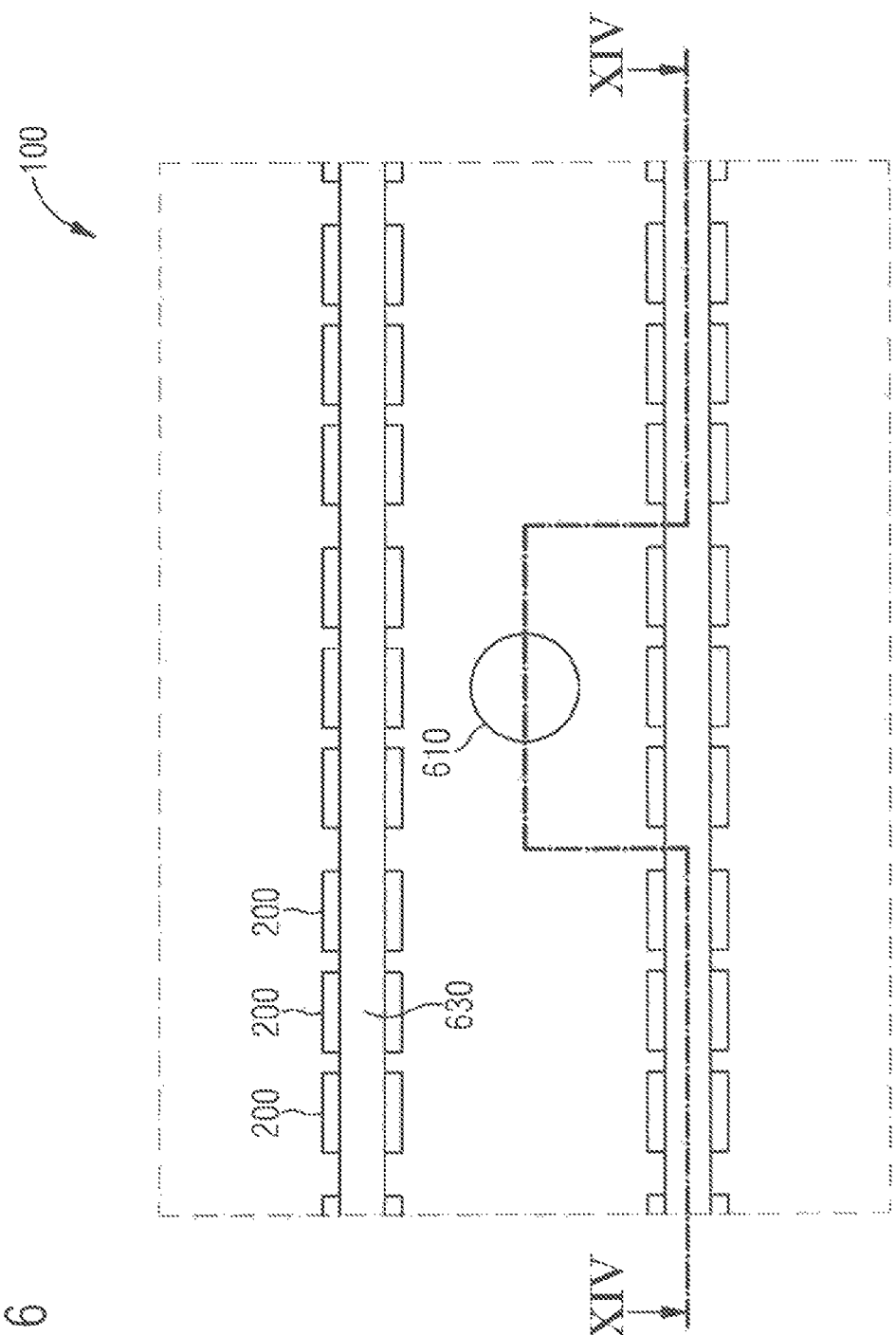

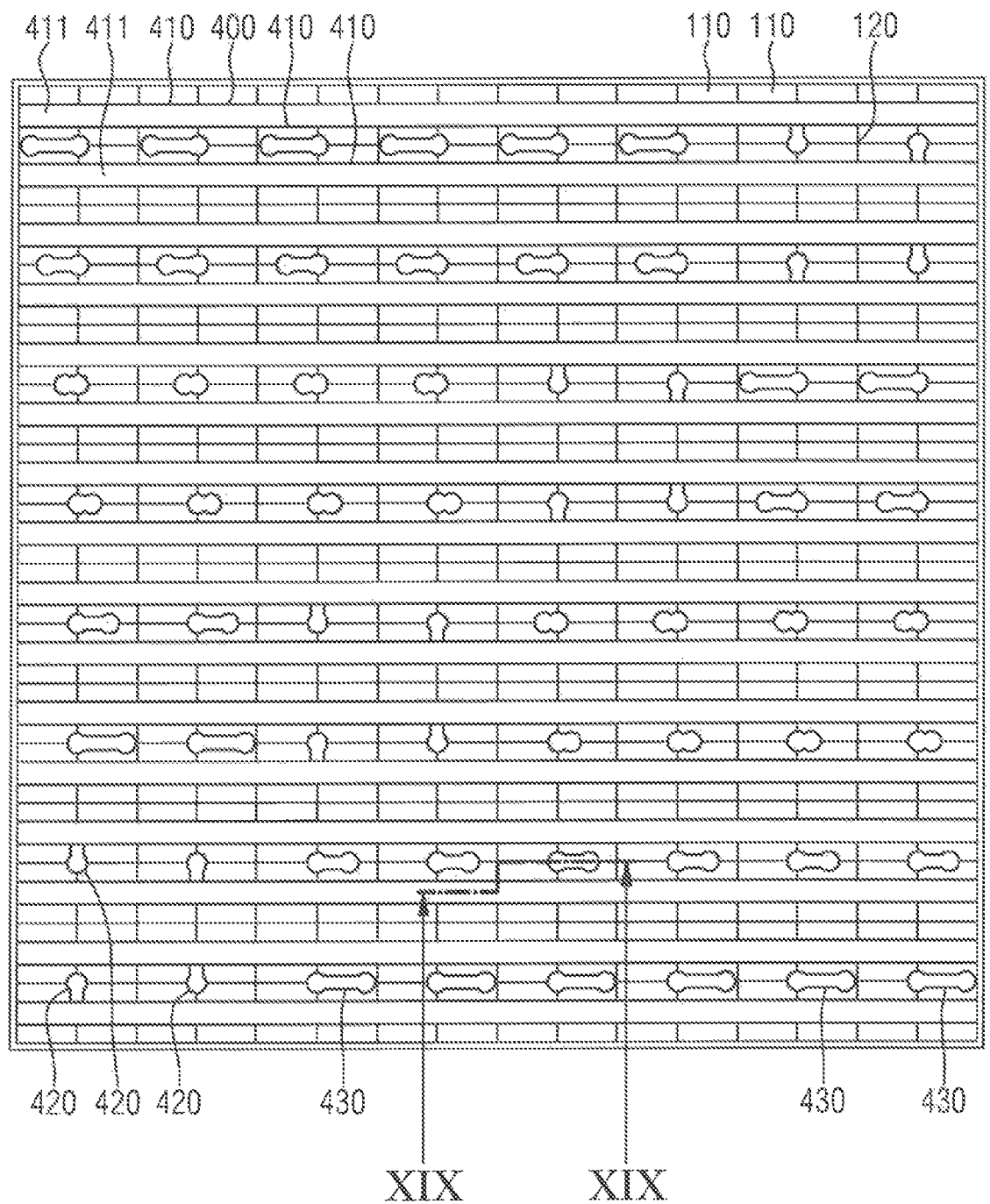

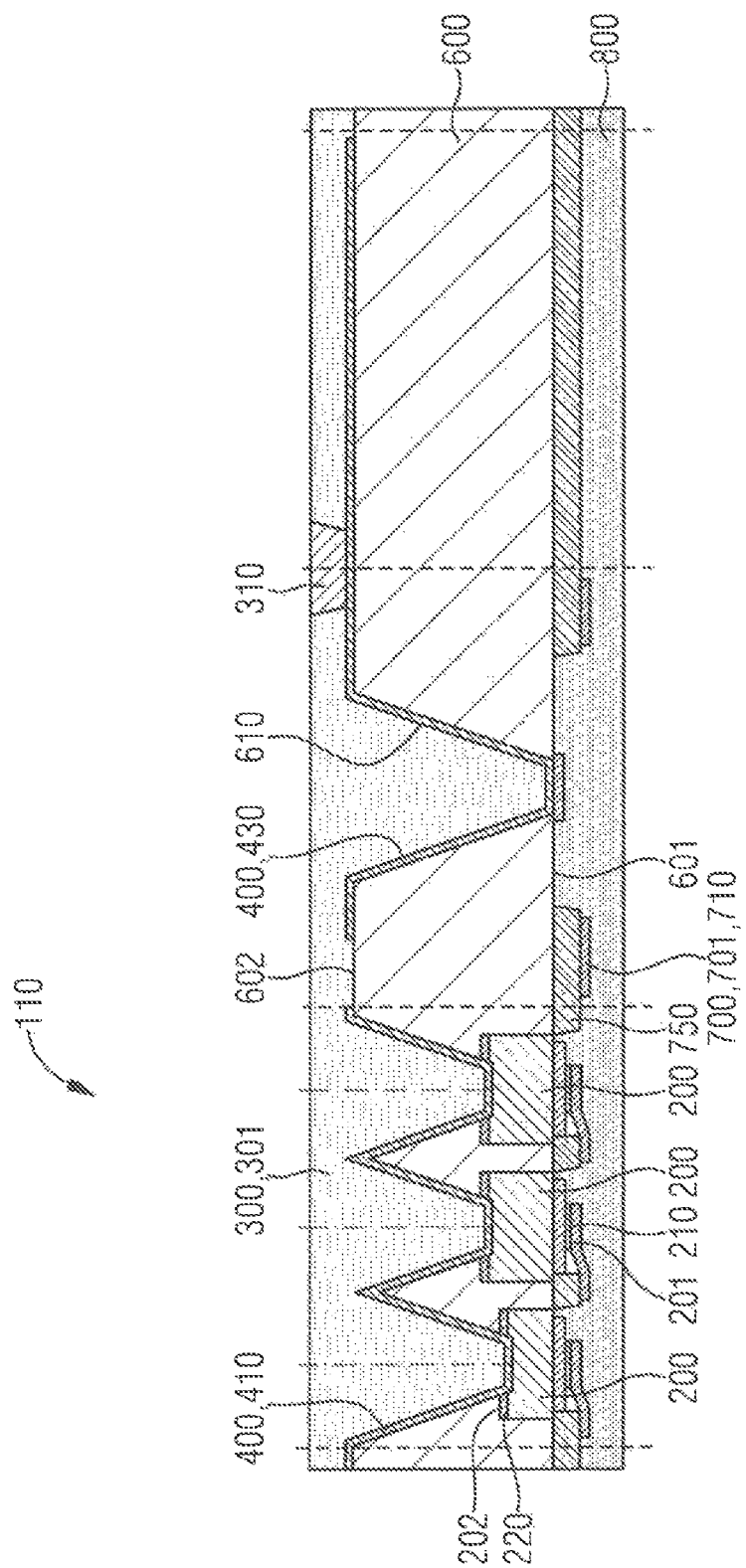

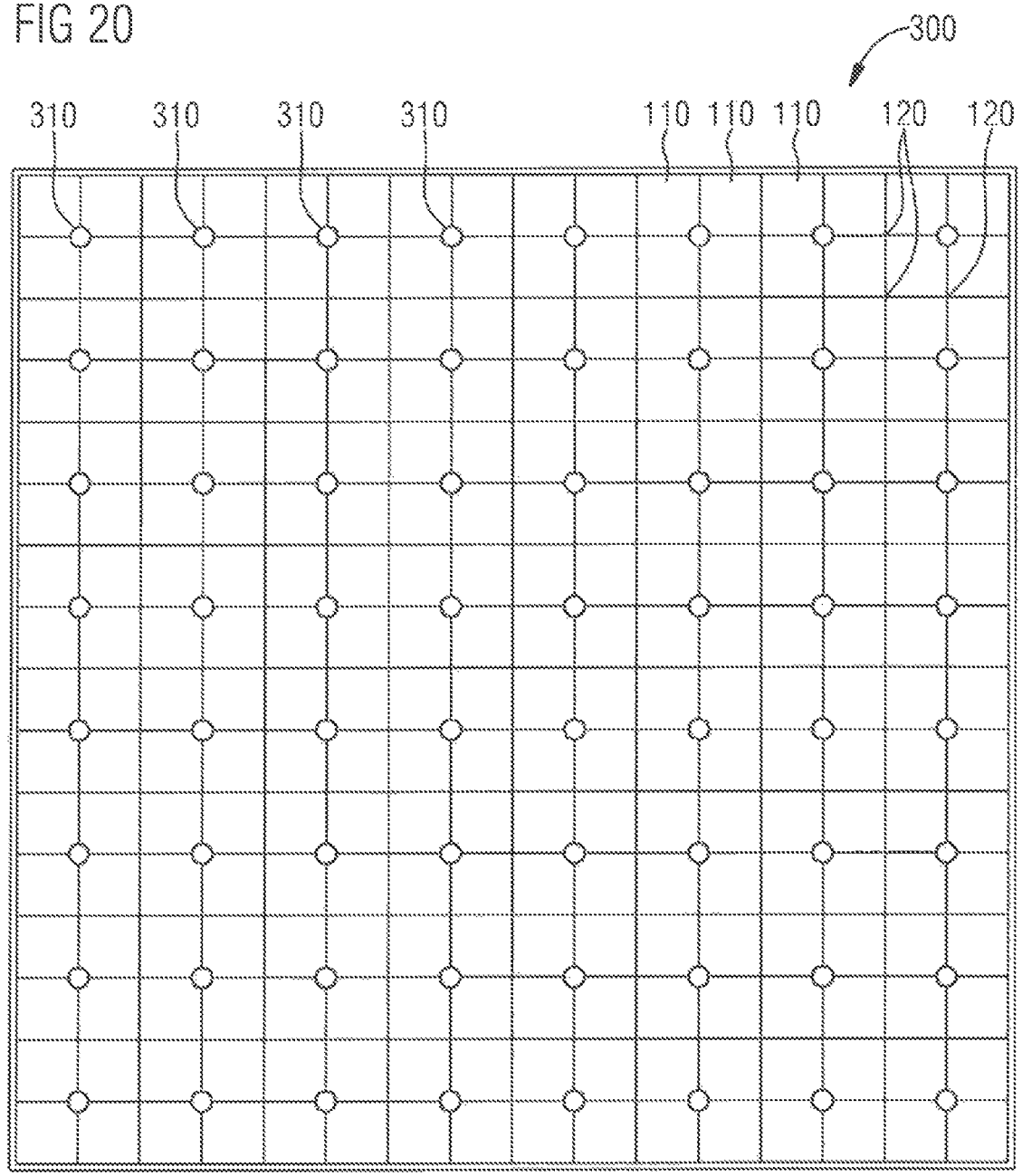

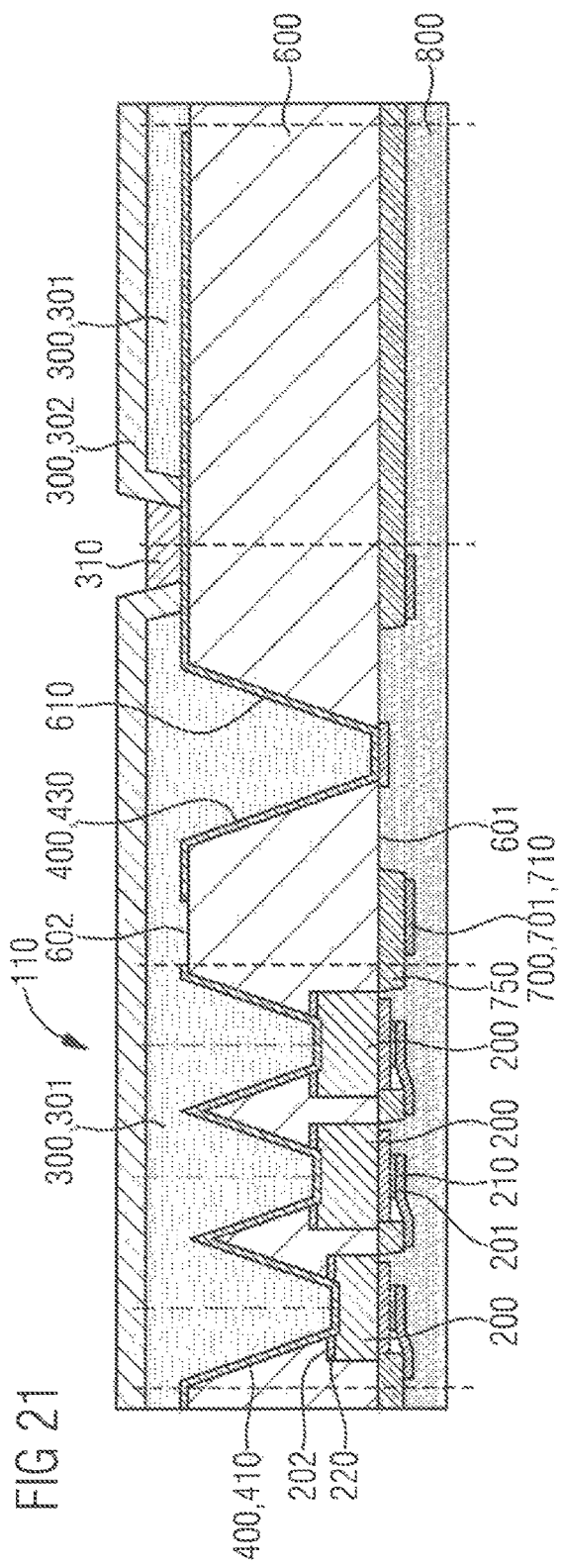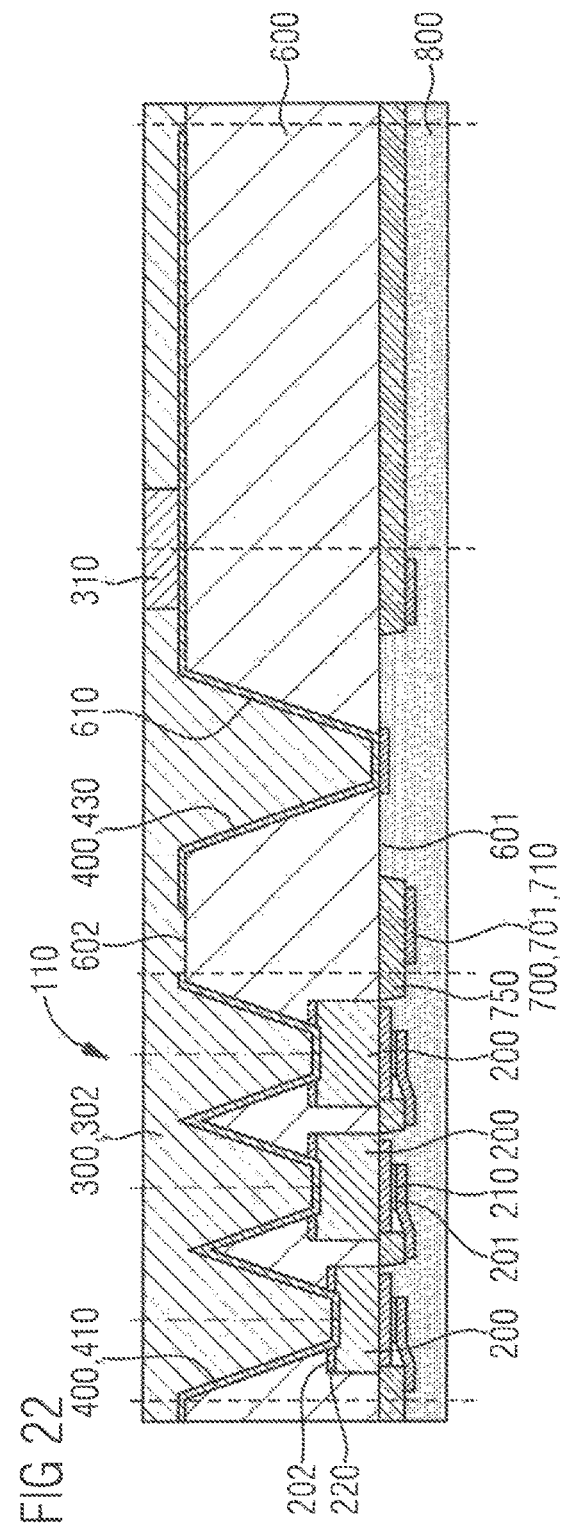

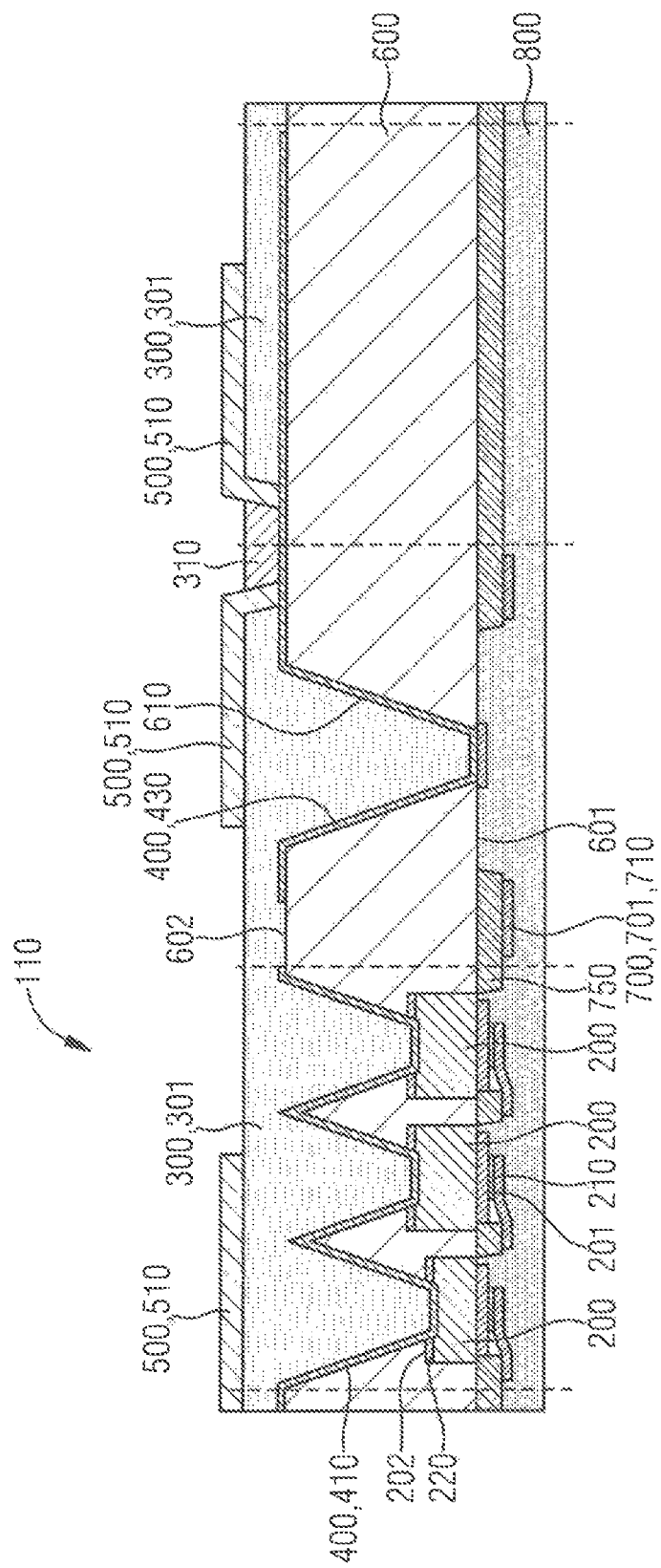

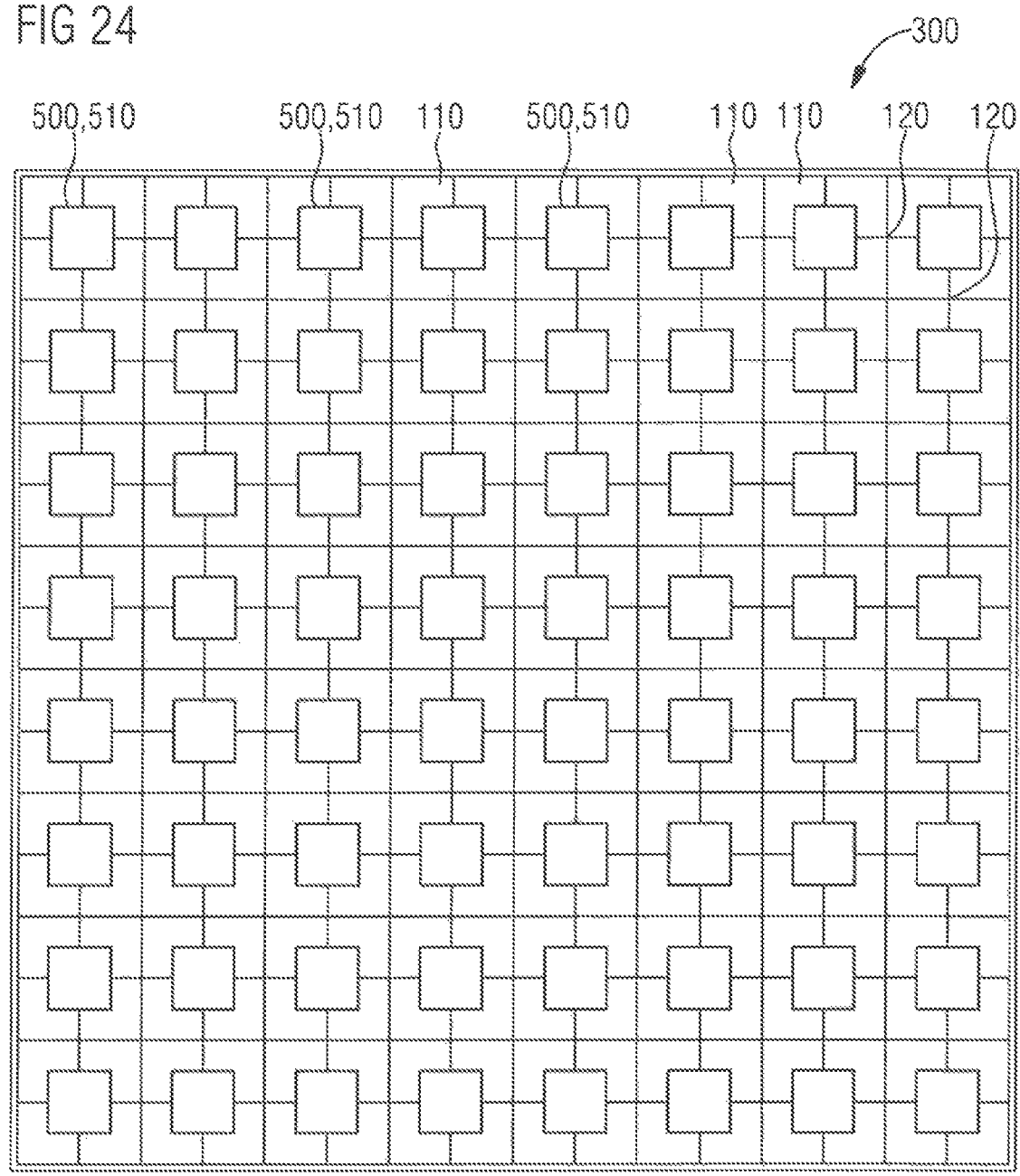

VIDEO WALL MODULE AND METHOD FOR PRODUCING SAME

This patent application is a national phase filing under section 371 of PCT/EP2016/067912, filed Jul. 27, 2017, which claims the priority of German patent application 10 2015 112 556.0, filed Jul. 30, 2015, each of which is incorporated herein by reference in its entirety.

TECHNICAL FIELD

The present invention relates to a video wall module and to a method for producing a video wall module.

BACKGROUND

Video wall modules for constructing video walls are known from the prior art. Video walls are display panels for static or moving pictures in which each pixel is formed by one or more light emitting diode chips. In order to achieve a high display quality, small distances of the pixels from one another, a high contrast and a uniform emission in different spatial directions are desirable.

SUMMARY OF THE INVENTION

Embodiments provide a video wall module. Further embodiments provide a method for producing a video wall module.

A video wall module may comprise a plurality of light emitting diode chips each comprising a top electrode arranged at a top side of the light emitting diode chip and a bottom electrode arranged at a bottom side of the light emitting diode chip. The light emitting diode chips are embedded into a molded body. The top electrodes are connected to a front-side metallization arranged at a front side of the molded body. The bottom electrodes are connected to a rear-side metallization arranged at a rear side of the molded body. A dielectric layer is arranged at the rear side of the molded body. The rear-side metallization is electrically conductively connected to an outer metallization arranged at the dielectric layer.

In various embodiments the molded body of this video wall module may comprise a thickness sufficient for achieving a high mechanical stability. As a result, the video wall module may be configured in a robust fashion.

In this case, the individual light emitting diode chips of the video wall module may advantageously comprise heights that deviate from one another, as a result of which different light emitting diode chips may be incorporated in the video wall module. By way of example, this makes it possible to configure the video wall module with light emitting diode chips which emit light in different wavelength ranges and at the same time comprise different chip thicknesses.

In this video wall module, the individual light emitting diode chips may advantageously be arranged very close together, as a result of which the video wall module may be suitable for generating high-resolution images.

In this video wall module, the dielectric layer arranged at the rear side of the molded body advantageously allows a reduction of stresses between the video wall module and a carrier on which the video wall module is mounted, said stresses being caused by different coefficients of thermal expansion.

In one embodiment of the video wall module, the light emitting diode chips are logically distributed among rows and columns of a matrix. In this case, the bottom electrodes of the light emitting diode chips are electrically connected to one another row by row by the rear-side metallization. The top electrodes of the light emitting diode chips are electrically connected to one another column by column by the front-side metallization. The light emitting diode chips of the video wall module are thus arranged in a cross-matrix interconnection. Advantageously, the video wall module thus requires only a small number of external electrical terminals and nevertheless enables each individual light emitting diode chip to be driven individually. In this case, all the light emitting diode chips of a common logical row or of a common logical column may be individually driven simultaneously. The individual logical rows and/or columns may be driven temporally successively in a multiplexing method.

In one embodiment of the video wall module, two or three adjacent light emitting diode chips of a row respectively form a pixel. In this case, the light emitting diode chips jointly forming a pixel may be configured for emitting light of different colors. By way of example, in each case a light emitting diode chip that emits in the red wavelength range, a light emitting diode chip that emits in the green wavelength range and a light emitting diode chip that emits in the blue wavelength range may form a pixel of the video wall module. Advantageously, the video wall module thus enables a colored representation.

In one embodiment of the video wall module, the pixels are arranged in a rectangular grid at the top side of the circuit board. In this case, the rectangular grid may coincide with the logical rows and columns of the cross-matrix interconnection, although this is not absolutely necessary.

In one embodiment of the video wall module, the light emitting diode chips of a pixel are arranged linearly alongside one another. Advantageously, this may result in a particularly high image quality of the video wall module.

In one embodiment of the video wall module, the top sides of the light emitting diode chips are not covered by the molded body. Advantageously, the molded body thus brings about no or only little shading or attenuation of electromagnetic radiation emitted by the light emitting diode chips at the top sides thereof. As a result, the video wall module may comprise a high luminosity.

In one embodiment of the video wall module, the bottom sides of the light emitting diode chips are at least partly covered by the molded body. In this case, the bottom electrodes are at least partly not covered by the molded body. This advantageously makes it possible to configure the molded body with a thickness that is greater than the thickness of the light emitting diode chips. This makes it possible to configure the molded body with high mechanical stability, which may result in a robust video wall module. At the same time, the fact that the bottom electrodes of the light emitting diode chips are at least partly not covered by the molded body makes it possible to electrically contact the bottom electrodes of the light emitting diode chips.

In one embodiment of the video wall module, the molded body comprises a greater thickness than the light emitting diode chips. As a result, the molded body may advantageously comprise a high mechanical stability.

In one embodiment of the video wall module, electrically conductive through contacts are arranged in the molded body, said through contacts providing electrically conductive connections between the front-side metallization and the rear-side metallization. Advantageously, the top electrodes of the light emitting diode chips of the video wall module, said top electrodes being electrically connected to the front-side metallization, may thereby be contacted via the rear-side metallization.

In one embodiment of the video wall module, electrically conductive through contacts are arranged in the dielectric layer, said through contacts providing electrically conductive connections between the rear-side metallization and the outer metallization. Advantageously, the video wall module may thereby be electrically contacted via the outer metallization arranged at the dielectric layer. In this case, the outer metallization enables an electrical contacting of the bottom electrodes of the light emitting diode chips of the video wall module and in combination with the electrically conductive through contacts arranged in the molded body may also enable an electrical contacting of the top electrodes of the light emitting diode chips. The outer metallization of the video wall module, said outer metallization being arranged at the dielectric layer, may enable, for example, surface mounting (SMT mounting) of the video wall module.

In one embodiment of the video wall module, the front-side metallization is covered at least in sections by a light absorbing layer. Advantageously, during the operation of the video wall module, this results in a particularly strong brightness contrast between the luminous top sides of the light emitting diode chips of the video wall module and sections of the top side of the video wall module which surround the top sides of the light emitting diode chips.

A method for producing a video wall module may comprise steps for embedding a plurality of light emitting diode chips, each comprising a top electrode arranged at a top side of the light emitting diode chip and a bottom electrode arranged at a bottom side of the light emitting diode chip, into a molded body, for arranging a front-side metallization at a front side of the molded body, wherein the front-side metallization is connected to the top electrodes, for arranging a rear-side metallization at a rear side of the molded body, wherein the rear-side metallization is connected to the bottom electrodes, for arranging a dielectric layer at the rear side of the molded body, and for arranging an outer metallization at the dielectric layer.

In various embodiments, this method enables a simple and cost-effective production of a video wall module. By embedding the light emitting diode chips into the molded body, it is possible for the video wall module obtainable by the method to be configured mechanically robustly and stably against fracture.

Advantageously, light emitting diode chips of different thicknesses are usable in this method. As a result, in the video wall module it is possible to combine, for example, light emitting diode chips which are configured for emitting electromagnetic radiation from different wavelength ranges and which comprise different chip thicknesses.

Advantageously very low product thickness tolerances arise here in the case of the video wall module obtainable by this method, which enables simple mounting of the video wall module. In particular, in the case of the video wall module obtainable by this method, all the emission faces of all the light emitting diode chips are situated with high accuracy in a common plane.

In the case of the video wall module obtainable by this method, the dielectric layer arranged at the rear side of the molded body advantageously allows a reduction of stresses between the video wall module and a carrier on which the video wall module is mounted, said stresses being caused by different coefficients of thermal expansion.

In one embodiment of the method, before arranging the front-side metallization, a further step is carried out for arranging an edge-insulating layer on edges of the top sides of the light emitting diode chips. Advantageously, burrs which are possibly present at the edges of the top sides of the light emitting diode chips and which are electrically connected to the potential of the bottom electrodes of the light emitting diode chips are thereby covered by the embedding material and thereby electrically insulated from the top electrodes of the light emitting diode chips. Undesired short circuits are advantageously avoided as a result.

In one embodiment of the method, before arranging the rear-side metallization, a further step is carried out for exposing the bottom electrodes, in particular by means of a laser process, a plasma process, a sandblasting process or a grinding separation process. Advantageously, an electrical contacting of the bottom electrodes of the light emitting diode chips is made possible by exposing the bottom electrodes of the light emitting diode chips. In this case, the molded body may nevertheless be configured with a thickness that is greater than the maximum chip thickness of the light emitting diode chips.

In one embodiment of the method, electrically conductive through contacts are arranged in the molded body, said through contacts providing electrically conductive connections between the front-side metallization and the rear-side metallization. Advantageously, in the case of the video wall module obtainable by the method, an electrical contacting of the top electrodes of the light emitting diode chips via the rear-side metallization is possible as a result.

In one embodiment of the method, electrically conductive through contacts are arranged in the dielectric layer, said through contacts providing electrically conductive connections between the rear-side metallization and the outer metallization. Advantageously, in the case of the video wall module obtainable by the method, an electrical contacting of the bottom electrodes and, in combination with electrically conductive through contacts applied in the molded body, of the top electrodes of the light emitting diode chips via the outer metallization arranged at the dielectric layer is made possible as a result. The video wall module obtainable by the method may thus be suitable, for example, as an SMT component for surface mounting.

In one embodiment of the invention, arranging the dielectric layer comprises a photolithographic method. Advantageously, a patterning of a dielectric layer is made possible as a result. This may serve, for example, to apply through contacts in the dielectric layer.

In one embodiment of the method, the latter comprises a further step for oxidizing the front-side metallization. Advantageously, the front-side metallization is darkened as a result, which may give rise to a high contrast between the light emitting top sides of the light emitting diode chips and the front-side metallization in the case of the video wall module obtainable by the method.

In one embodiment of the method, the latter comprises a further step for applying a light absorbing layer on the front-side metallization. Advantageously, this also gives rise to a high contrast between the light emitting top sides of the light emitting diode chips and the light absorbing layer on the front-side metallization.

BRIEF DESCRIPTION OF THE DRAWINGS

The above-described properties, features and advantages of this invention and the way in which they are achieved will become clearer and will be more clearly understood in association with the following description of the exemplary embodiments which are explained in greater detail in association with the drawings. Here in each case in a schematic illustration:

FIG. 7 shows a sectional side view of the molded body with the light emitting diode chips embedded therein after the process of arranging an edge-insulating layer above edges of the top sides of the light emitting diode chips;

FIG. 8 shows a sectional side view of the molded body after the process of applying a front-side metallization at a front side of the molded body;

FIG. 9 shows a plan view of part of the front-side metallization;

FIG. 14 shows a sectional side view of the molded body after a process of creating contact trenches and openings for through contacts;

FIG. 15 shows a further sectional side view of part of the molded body after the process of creating the contact trenches;

FIG. 16 shows a plan view of part of the molded body after the process of creating the contact trenches and the openings for through contacts;

FIG. 18 shows a plan view of the rear-side metallization;

FIG. 19 shows a sectional side view of the molded body after the process of arranging a molded layer forming a dielectric layer at a rear side of the molded body;

FIG. 20 shows an illustration of positions of through contacts arranged in the dielectric layer;

FIG. 21 shows a sectional side view of the molded body after the process of applying an elastomeric layer forming a part of the dielectric layer;

FIG. 22 shows a sectional side view of the molded body after the process of applying an elastomeric layer forming the entire dielectric layer;

FIG. 23 shows a sectional side view of the molded body and of the dielectric layer after a process of applying an outer metallization;

FIG. 24 shows an illustration of the positions of contact pads of the outer metallization.

DETAILED DESCRIPTION OF ILLUSTRATIVE EMBODIMENTS

Figure 1:
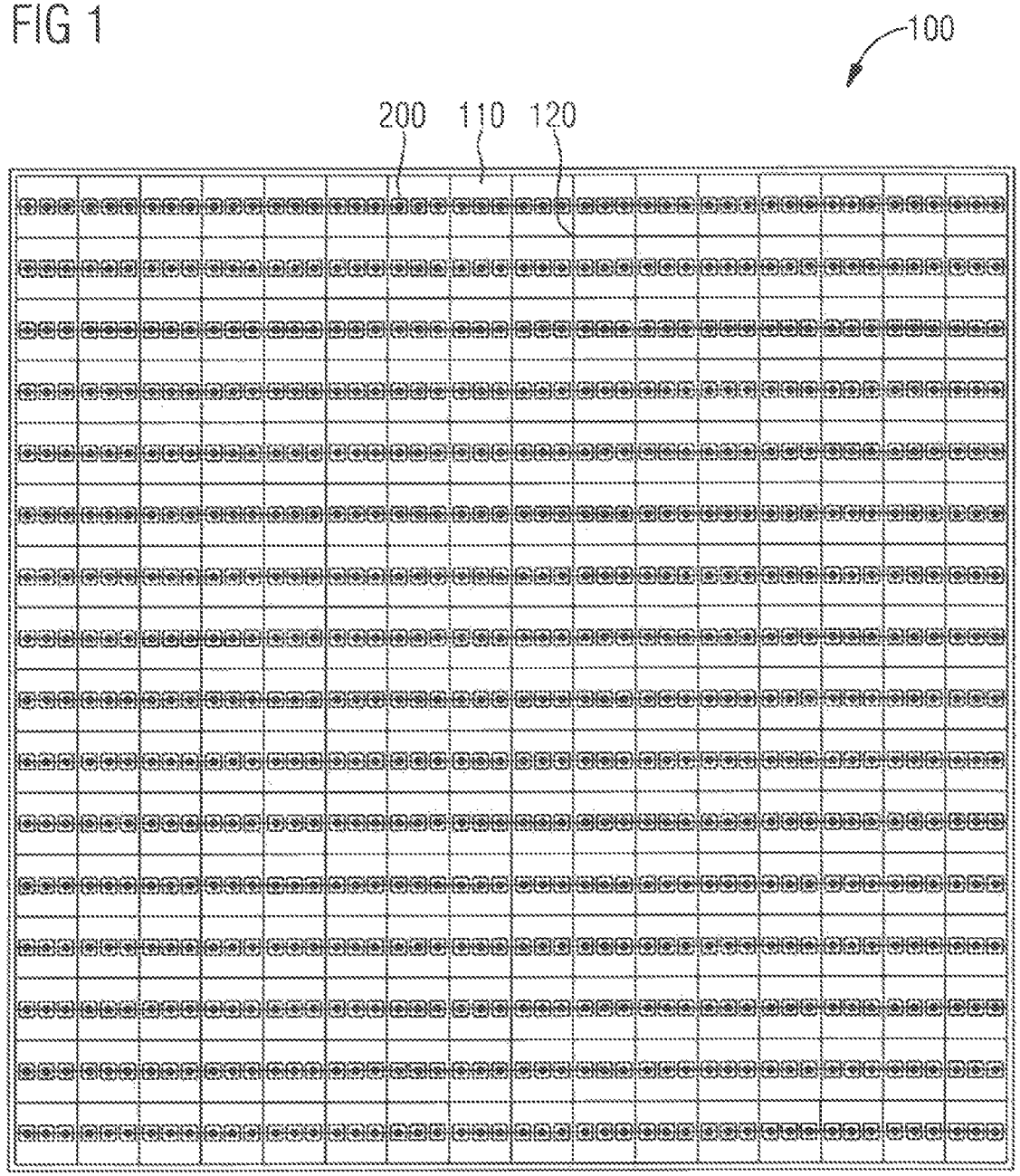
FIG. 1 shows a plan view of pixels of a video wall module.

FIG. 1 shows a highly schematic plan view of a video wall module 100. The video wall module 100 is illustrated incompletely and in a simplified manner in FIG. 1, in order to illustrate the fundamental geometry of the video wall module 100.

The video wall module 100 may serve as a module for constructing a larger video wall. In this case, the video wall may comprise a multiplicity of video wall modules 100 of identical type. The video wall may serve for displaying static or moving mono- or polychromatic pictures.

The video wall module 100 comprises a plurality of pixels 110 arranged in a regular two-dimensional pixel raster 120. In the example shown in FIG. 1, the video wall module 100 comprises 16×16 pixels 110. The pixel raster 120 thus comprises 16 columns and 16 rows. However, it is likewise possible to configure the video wall module 100 with a different number of pixels 110, for example, with 8×8 pixels 110, with 4×4 pixels 110 or with 32×32 pixels 110. It is likewise possible for the number of rows of the pixel raster 120 to differ from the number of columns of the pixel raster 120. In this case, the video wall module 100 may comprise, for example, 8×16 pixels 110.

The pixels 110 of the video wall module 100 are configured in a square fashion in the example shown in FIG. 1. Since the pixel raster 120 is also square in the example shown in FIG. 1, the video wall module 100 overall comprises a square shape. However, the pixels 100 could also be configured in a rectangular fashion. In this case, the video wall module may comprise a non-square rectangular shape. It is likewise conceivable to configure the pixels 110 with a non-square rectangular shape and to configure the pixel raster 120 with a different number of rows and columns, such that the video wall module 100 overall comprises a square shape.

The individual pixels 110 of the video wall module 100 may comprise an edge length which is, for example, between 0.3 mm and 2 mm, in particular, for example, between 0.5 mm and 1 mm. If the pixels 110 are configured in a square fashion, then they may thus comprise, for example, a size of 1×1 mm. In this case, the video wall module 100 may comprise, for example, an edge length of 16 mm.

Each pixel 110 of the video wall module 100 comprises three light emitting diode chips (LED chips) 200 in the example shown in FIG. 1. The three light emitting diode chips 200 of a pixel 110 may be configured to emit light of different colors. By way of example, the three light emitting diode chips 200 of a pixel 110 may be configured to emit red, green and blue light. By means of additive mixing of the radiation emitted by the light emitting diode chips 200 of a pixel 110, each pixel 110 is thus enabled to emit light with a color that is adjustable within wide limits.

However, it is likewise possible to configure the video wall module 100 with a different number of light emitting diode chips 200 per pixel 110. By way of example, each pixel 110 of the video wall module 100 may comprise one light emitting diode chip 200 or two light emitting diode chips 200. In this case, the light emitting diode chips 200 may be configured, for example, to emit blue, green, yellow, red or orange light.

In the example shown in FIG. 1, the individual light emitting diode chips 200 of a pixel 110 are arranged linearly alongside one another. In this case, the light emitting diode chips 200 are arranged in rows in such a way that all the light emitting diode chips 200 of all the pixels 110 of a row of the pixel raster 120 of the video wall module 100 are arranged in a common row. However, it is likewise possible to arrange the light emitting diode chips 200 of a pixel 110 linearly alongside one another in columns, such that all the light emitting diode chips 200 of all the pixels 110 of a column of the pixel raster 120 of the video wall module 100 are arranged in a common column. It is likewise possible to arrange the individual light emitting diode chips 200 of a pixel 110 alongside one another in a different way than linearly. However, a linear arrangement of the individual light emitting diode chips 200 of a pixel 110 of the video wall module 100 may afford advantages in the case of the image quality achievable by the video wall module 100.

The individual light emitting diode chips 200 of a pixel 110 may comprise, for example, a spacing (light emitting diode chip-to-light emitting diode chip spacing) that is between 30 μm and 60 μm. In this case, the individual light emitting diode chips 200 may comprise, for example, edge lengths that are between 0.13 mm and 0.24 mm.

Figure 2:
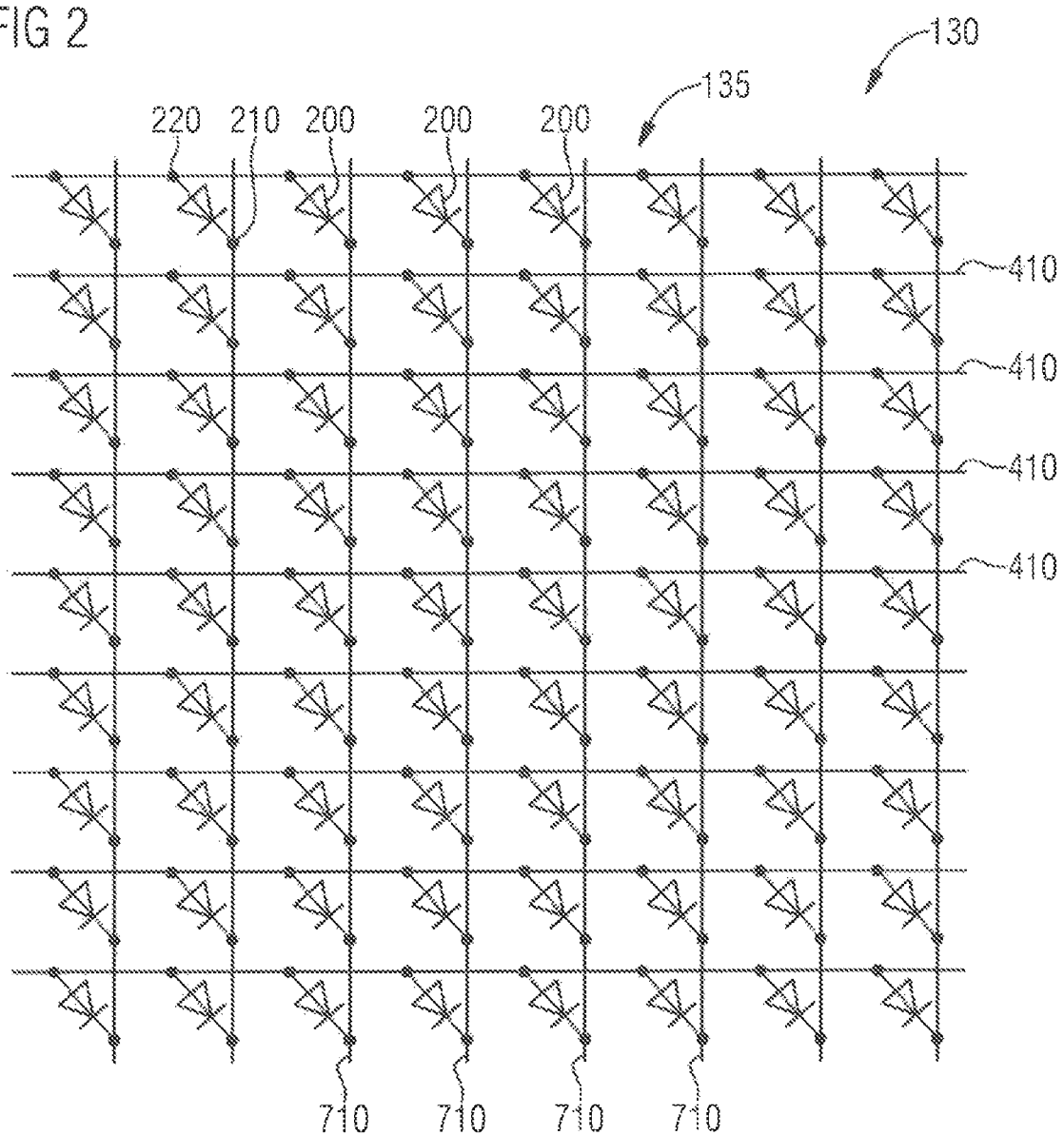
FIG. 2 shows a circuit diagram of a cross-matrix interconnection of a video wall module.

The light emitting diode chips 200 of the video wall module 100 are arranged in a cross-matrix interconnection 130, an excerpt from which is illustrated schematically in FIG. 2.

Each light emitting diode chip 200 comprises a cathode, which in the present example is electrically connected to a top electrode 210 of the light emitting diode chip 200. Moreover, each light emitting diode chip 200 of the video wall module 100 comprises an anode, which in the present example is electrically connected to a bottom electrode 220 of the respective light emitting diode chip 200. However, it is also possible for cathode and anode of each light emitting diode chip 200 to be oppositely electrically connected to the bottom electrode 220 and the top electrode 210 of the respective light emitting diode chip 200.

The cross-matrix interconnection 130 comprises a logical matrix 135 of logical rows and logical columns. The light emitting diode chips 200 are distributed among the logical matrix 135 of the cross-matrix interconnection 130 in such a way that one of the light emitting diode chips 200 is arranged at each crossover of a logical row and a logical column. In this case, the bottom electrodes 220 of all the light emitting diode chip 200 are electrically connected to one another by a row line 410 of the cross-matrix interconnection 130. The top electrodes 210 of all the light emitting diode chips 200 of a common column of the logical matrix 135 of the cross-matrix interconnection 130 are electrically connected to one another by a column line 710. Thus, the bottom electrodes 220 of the light emitting diode chips 200 of the video wall module 100 are therefore connected row by row by the row lines 410, while the top electrodes 210 of the light emitting diode chips 200 are electrically connected to one another column by column by the column lines 710.

The cross-matrix interconnection 130 makes it possible for all the light emitting diode chips 200 of a row of the logical matrix 135 to be simultaneously driven independently of one another. The light emitting diode chips 200 of all the other rows of the logical matrix 135 are not driven during this time. The individual rows of the logical matrix 135 may be driven temporally successively (row multiplexing method) in order that all the light emitting diode chips 200 arranged in the cross-matrix interconnection 130 are addressed independently of one another in this way.

The rows and columns of the logical matrix 135 of the cross-matrix interconnection 130 may correspond to the rows and columns of the pixel raster 120 of the video wall module 100. This enables all the light emitting diode chips 200 of all the pixels 110 of a row of the pixel raster 120 of the video wall module 100 to be driven simultaneously and independently of one another, while the individual rows of the pixel raster 120 are driven temporally successively. The individual light emitting diode chips 200 of a pixel 110 here are arranged in each case in a common row of the logical matrix 135 of the cross-matrix interconnection 130, such that the individual light emitting diode chips 200 of a pixel 110 may also be simultaneously driven independently of one another. The logical matrix 135 of the cross-matrix interconnection 130 thus comprises, given three light emitting diode chips 200 per pixel 110, three columns per column of the pixel raster 120.

The cross-matrix interconnection 130 makes it possible to drive the light emitting diode chips 200 of the video wall module 100 with a number of external contacts which is less than the sum of all the top electrodes 210 and bottom electrodes 220 of all the light emitting diode chips 200 of the video wall module 100. Only one external contact per row line 410 and one external contact per column line 710 are required. In the case of an exemplary video wall module 100 comprising 16×16 pixels 110 and three light emitting diode chips 200 per pixel 110, 16 row lines 410 and 3×16 column lines 710 are required, that is to say therefore 64 external contacts.

Figure 3:
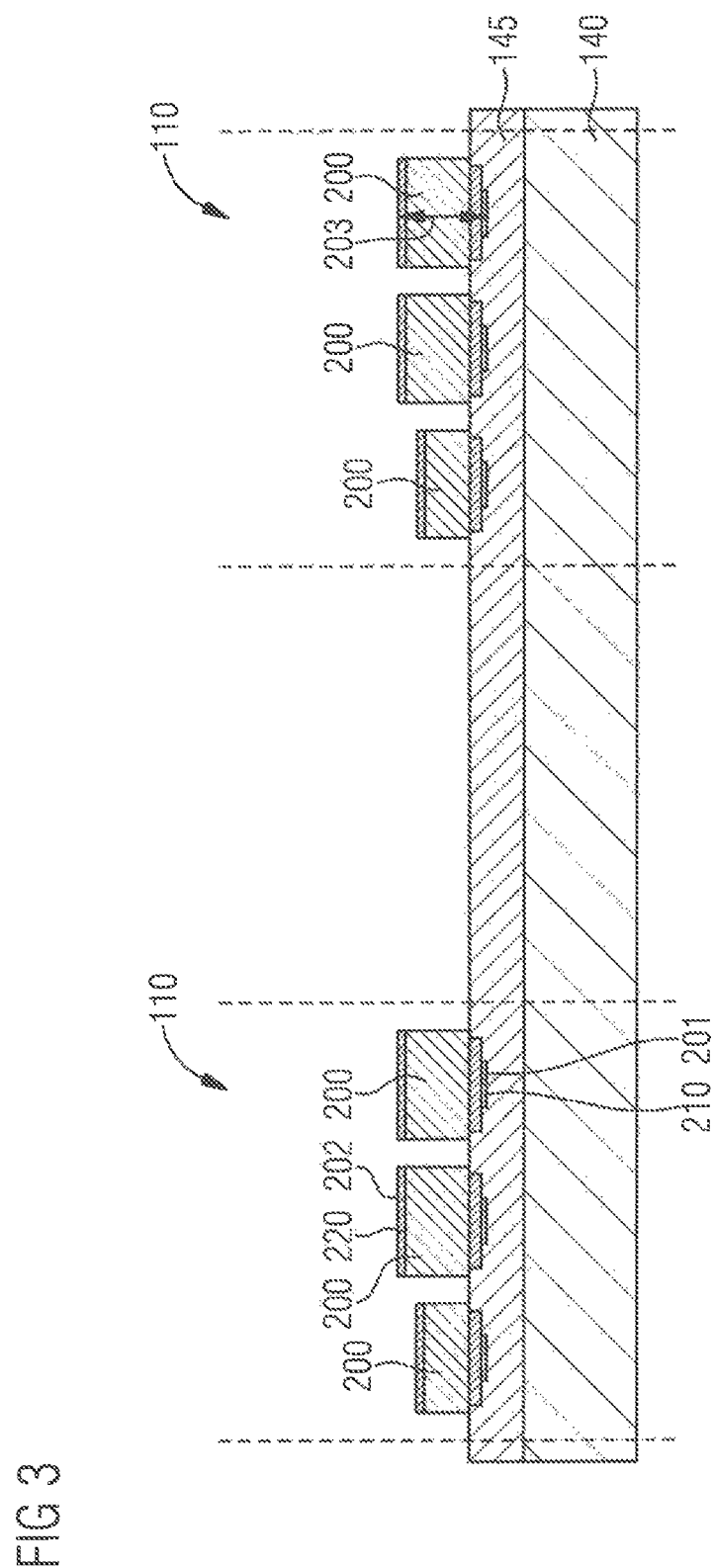
FIG. 3 shows a sectional side view of a temporary carrier used for producing a video wall module, with light emitting diode chips arranged thereabove.

FIG. 3 shows a schematic sectional side view of part of a temporary carrier 140 used for producing the video wall module 100. A double-sided adhesive 145 is arranged at a top side of the temporary carrier 140. One or both adhesive sides of the adhesive film 145 may be thermally releasable.

The light emitting diode chips 200 provided for producing the video wall module 100 have been arranged at the adhesive film 145 above the temporary carrier 140. Each light emitting diode chip 200 comprises a top side 201 and a bottom side 202 situated opposite the top side 201. The top electrode 210 of each light emitting diode chip 200 is accessible at the top side 201 thereof. The bottom electrode 220 of each light emitting diode chip 200 is accessible at the bottom side 202 thereof.

The top sides 201 of the light emitting diode chips 200 form radiation emission faces of the light emitting diode chips 200. During the operation of the light emitting diode chips 200, the latter emit electromagnetic radiation at their top sides 201.

The light emitting diode chips 200 are arranged at the adhesive film 145 in such a way that the top sides 201 of the light emitting diode chips 200 face the adhesive film 145 and the temporary carrier 140 and are in contact with the adhesive film 145.

Figure 4:
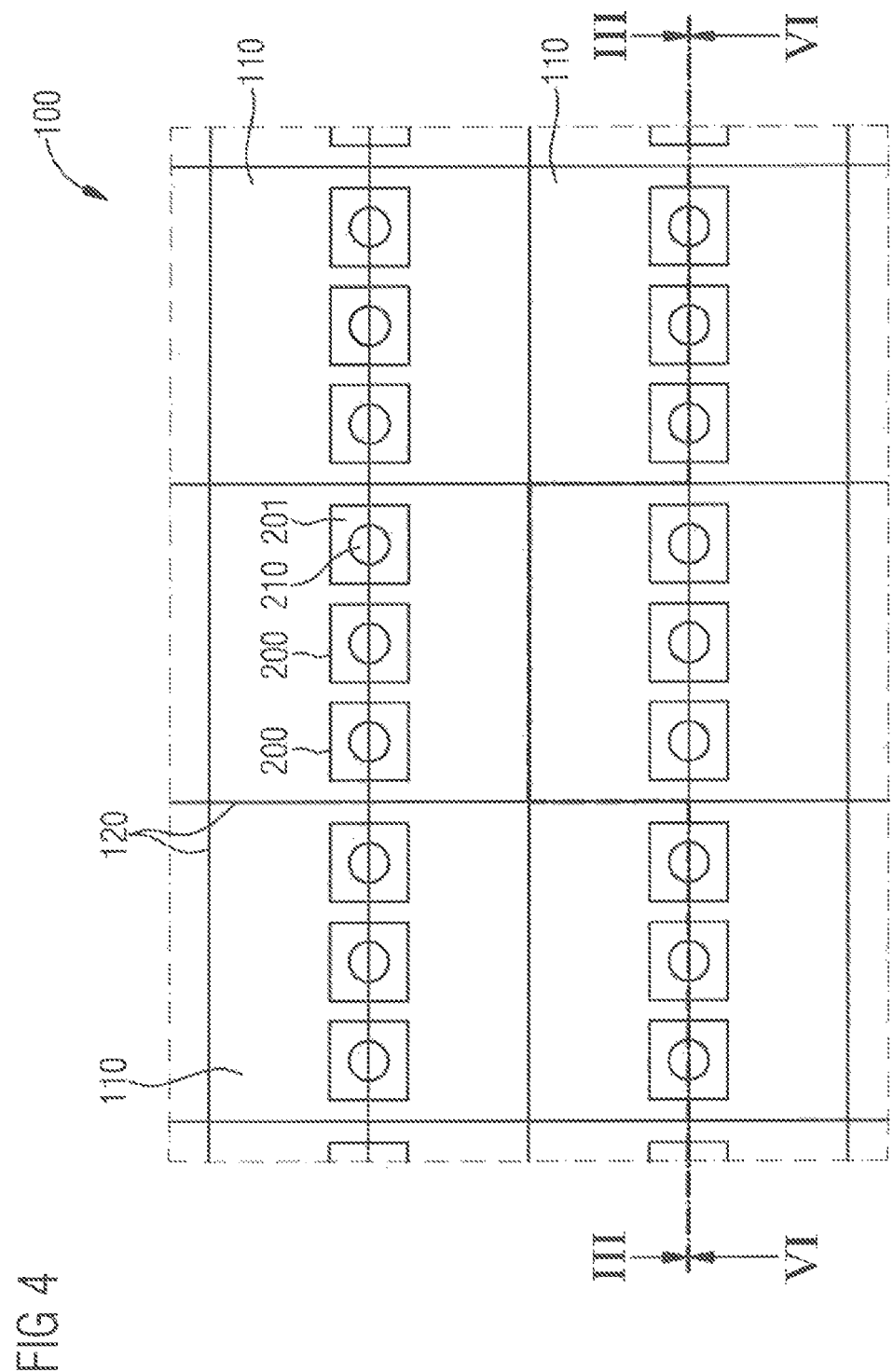
FIG. 4 shows a plan view of some light emitting diode chips arranged above the temporary carrier.

The excerpt from the temporary carrier 140 as shown in FIG. 3 comprises three columns of the pixel raster 120 of the video wall module 100 to be produced. FIG. 4 shows an enlarged excerpt from the schematic illustration of the video wall module 100 shown in FIG. 1, said excerpt depicting the course of the sectional line at which the illustration in FIG. 3 is cut. In the left-hand and right-hand parts of FIG. 3, the section extends through two pixels 110 of a common row of the pixel raster 120. In the middle region of FIG. 3, by contrast, the section extends between two rows of the pixel raster 120. The same sectional plane is also used in the illustrations in FIGS. 5, 6, 7, 8, 10, 11, 14 and 17. The pixel raster 120 and the pixels 110 are depicted in FIGS. 3 and 4, and also in the subsequent figures, for the sake of better understanding.

Each light emitting diode chip 200 comprises a thickness 203 measured from its top side 201 to its bottom side 202. The thicknesses 203 of the light emitting diode chips 200 may be, for example, between 0.12 and 0.19 mm. The thicknesses 203 of the light emitting diode chips 200 forming a common pixel 110 of the video wall module 100 may differ from one another here. By virtue of their arrangement at the adhesive film 145 above the temporary carrier 140, however, the top sides 201 of the light emitting diode chips 200 are at any rate situated with high accuracy in a common plane.

Figure 5:
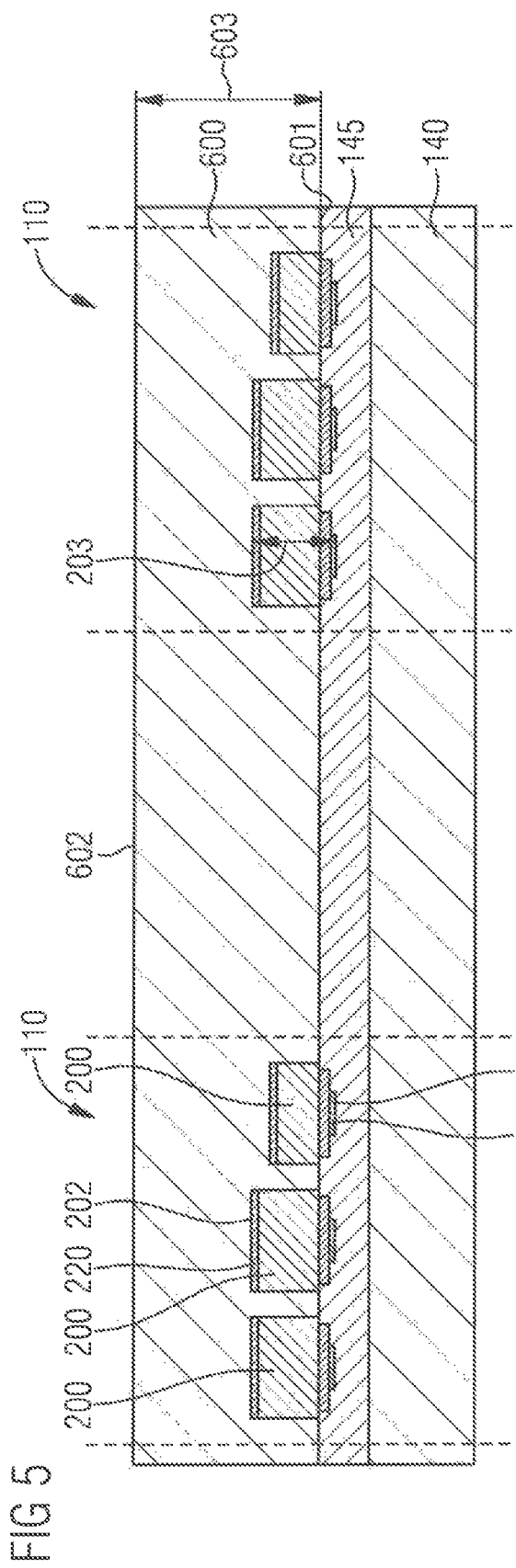
FIG. 5 shows a sectional side view of the light emitting diode chips after the process of embedding into a molded body.

FIG. 5 shows a schematic sectional side view of the temporary carrier 140 and of the light emitting diode chips 200 arranged above the temporary carrier 140, in a processing state temporally succeeding the illustration in FIG. 3.

On that side of the adhesive film 145 which faces away from the temporary carrier 140, a molded body 600 has been formed above the temporary carrier 140. In this case, the light emitting diode chips 200 have been embedded into the molded body 600. The molded body 600 has been formed by means of a molding method (mold method), in particular, for example, by means of compression molding or by means of transfer molding.

The molded body 600 has been formed from a liquid or granular molding material (mold material). The molding material comprises an electrically insulating plastic, for example, an epoxy. The molding material may also comprise an embedded glass fiber fabric. It is expedient if the material forming the molded body 600 comprises a black or some other dark color. However, this is not necessary particularly if the front side of the molded body 600 is at least partly covered by a light absorbing layer in a later method step, which will be described below.

The molded body 600 comprises a front side 601 and a rear side 602 situated opposite the front side 601. Between its front side 601 and its rear side 602, the molded body 600 comprises a thickness 603 measured perpendicularly to the front side 601.

The front side 601 of the molded body 600 has been formed in a manner bearing against the adhesive film 145. Since the top sides 201 of the light emitting diode chips 200 embedded into the molded body 600 also bear against the adhesive film 145 above the temporary carrier 140, the top sides 201 of the light emitting diode chips 200 have not been covered by the material of the molded body 600 during the process of forming the molded body 600, but rather are accessible at the front side 601 of the molded body 600 and terminate flush with the front side 601 of the molded body 600.

The thickness 603 of the molded body 600 is greater than the thicknesses 203 of the light emitting diode chips 200. Consequently, the bottom sides 202 of the light emitting diode chips 200 have been covered by the material of the molded body 600 and are not accessible at the rear side 602 of the molded body 600. It is expedient for the thickness 603 of the molded body 600 to be greater than 0.2 mm. In this case, the molded body 600 may comprise a high mechanical stability. By way of example, the thickness 603 of the molded body 600 may be between 0.3 mm and 1.0 mm.

Figure 6:
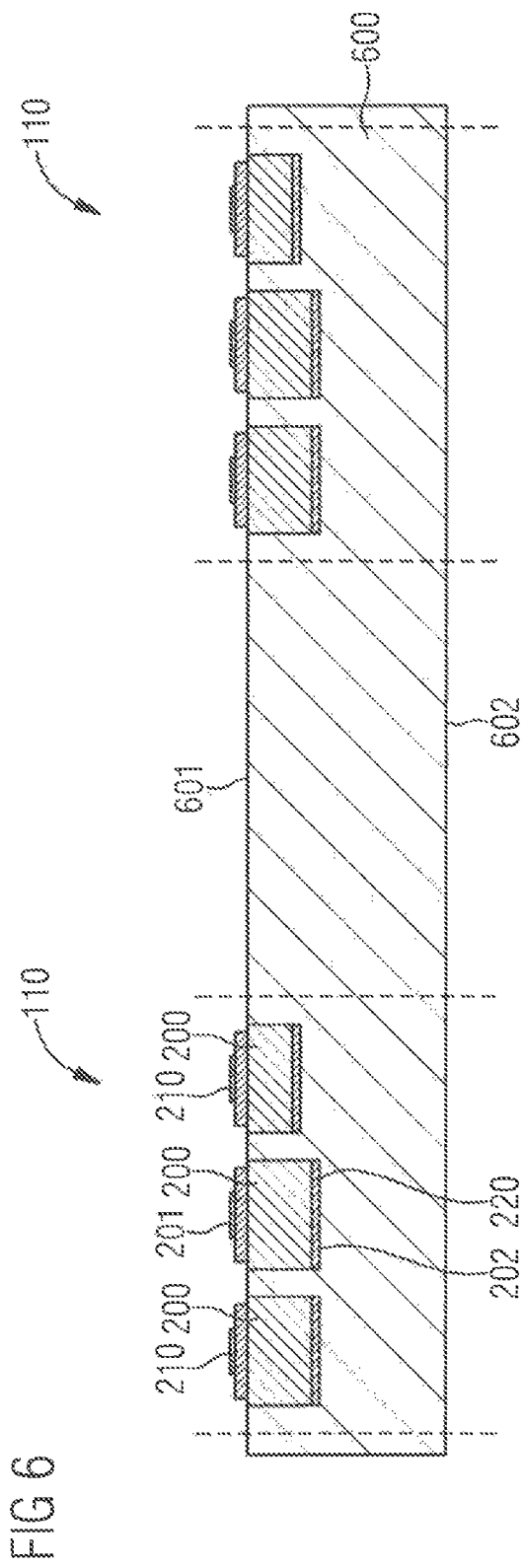
FIG. 6 shows a sectional side view of the molded body after the process of detaching from the temporary carrier.

FIG. 6 shows a schematic sectional side view of the molded body 600 with the light emitting diode chips 200 embedded therein, in a processing state temporally succeeding the illustration in FIG. 5.

The molded body 600 and the light emitting diode chips 200 embedded therein have been detached from the adhesive film 145 and the temporary carrier 140. This may have been carried out, for example, by means of a thermal process and/or by means of pulling off the adhesive film 145.

After the process of detaching the molded body 600 from the temporary carrier 140, it may have been necessary to remove material of the molded body 600 that passed over the top sides 201 of the light emitting diode chips 200 possibly in the region of the front side 601 of the molded body 600 (deflashing).

If the thickness 603 of the molded body 600 is small, it may be necessary to arrange the molded body 600 on a hard carrier for the purpose of mechanical stabilization during the subsequent processing steps. In this case, the rear side 602 of the molded body 600 faces the carrier.

FIG. 7 shows a schematic sectional side view of the molded body 600 and of the light emitting diode chips 200 embedded therein, in a processing state temporally succeeding the illustration in FIG. 6.

An edge-insulating layer 750 has been arranged at the front side 601 of the molded body 600. The edge-insulating layer 750 comprises a dielectric material. The edge-insulating layer 750 may have been arranged and patterned at the front side 601 of the molded body 600, for example, by means of a photolithographic method. In this case, the edge-insulating layer 750 expediently comprises a photo-patternable dielectric. The edge-insulating layer 750 may comprise, for example, a thickness of 5 µm in a direction measured perpendicularly to the front side 601 of the molded body 600.

The edge-insulating layer 750 covers at least parts of the front side 601 of the molded body 600 and also parts of the edges of the top sides 201 of the light emitting diode chips 200 that are exposed at the front side 601 of the molded body 600. The edges of the top sides 201 of the light emitting diode chips 200 may comprise burrs (slag burrs) that are electrically conductively connected to the bottom electrodes 220 of the light emitting diode chips 200. Said burrs are electrically insulated by the covering by the edge-insulating layer 750.

The top electrodes 210 of the light emitting diode chips 200 arranged at the top sides 201 of the light emitting diode chips 200 are not covered by the edge-insulating layer 750. The remaining sections, too, of the top sides 201 of the light emitting diode chips 200 are substantially not covered by the edge-insulating layer 750.

During the process of arranging the edge-insulating layer 750 above the front side 601 of the molded body 600, the top sides 201 of the light emitting diode chips 200 may firstly have been completely covered by the material of the edge-insulating layer 750. Afterward, at least parts of the top sides 201 of the light emitting diode chips 200 have been uncovered again by means of a photopatterning method.

FIG. 8 shows a schematic sectional side view of the molded body 600 and of the light emitting diode chips 200 embedded therein, in a processing state temporally succeeding the illustration in FIG. 7.

A front-side metallization 700 has been arranged at the front side 601 of the molded body 600. FIG. 9 shows a plan view of part of the front-side metallization 700 in a schematic illustration. The front-side metallization 700 forms the column lines 710 of the cross-matrix interconnection 130 of the video wall module 100.

The front-side metallization 700 is configured as planar metallization. Applying and patterning the front-side metallization 700 may have been carried out, for example, by means of a photolithographic method. Applying and patterning the front-side metallization 700 may comprise, for example, process steps for applying a seed layer, carrying out a photographic technique, carrying out an electrolytic process, removing the photoresist and etching the seed layer. Alternatively, applying and patterning the front-side metallization 700 may comprise, for example, a lift-off process or the use of a patterned seed layer.

The front-side metallization 700 may comprise, for example, a metal sequence comprising Ni and Ag. By way of example, the metal sequence may comprise 5 µm Ni and 0.1 µm Ag. The front-side metallization 700 may also comprise Cu, Al, Pd, Au, W or some other metal or an electrically conductive plastic or graphene or some other electrically conductive material.

In the example illustrated schematically in FIGS. 8 and 9, the front-side metallization 700 covers the front side 601 of the molded body 600 over a large area. The individual column lines 710 are separated from one another only by narrow trenches. The trenches here are narrower than the column lines 710. However, it is also possible to configure the column lines 710 to be narrower than is illustrated, for example, narrower than the trenches separating the column lines 710. In this case, the front-side metallization covers the front side 601 of the molded body 600 less completely.

In the regions of the top sides 201 of the light emitting diode chips 200, the column lines 710 in the example illustrated in FIGS. 8 and 9 in the form of narrow connection webs 720 lead past the top sides 201 of the light emitting diode chips 200. As a result, a light emission at the top sides 201 of the light emitting diode chips 200 is not impeded by the metal of the column lines 710.

The top electrodes 210 of the light emitting diode chips 200 are connected to the column lines 710 in each case via narrow terminal webs 730. In the example shown in FIGS. 8 and 9, the terminal webs 730 connect the top electrodes 210 respectively to the connection webs 720. However, a different geometry is also possible. It is likewise possible to lead the connection webs 720 over the top sides 201 of the light emitting diode chips 200, in which case they may also perform the function of the terminal webs 730.

In the example illustrated schematically in FIGS. 8 and 9, the top electrodes 210 are arranged in the centers of the top sides 201 of the light emitting diode chips 200. However, it may be expedient to arrange the top electrodes 210 in each case in a marginal or corner region of the top sides 201 of the light emitting diode chips 200.

The connection webs 720 and the terminal webs 730 are electrically insulated from the edges of the top sides 201 of the light emitting diode chips 200 by sections of the edge-insulating layer 750.

Figure 10:
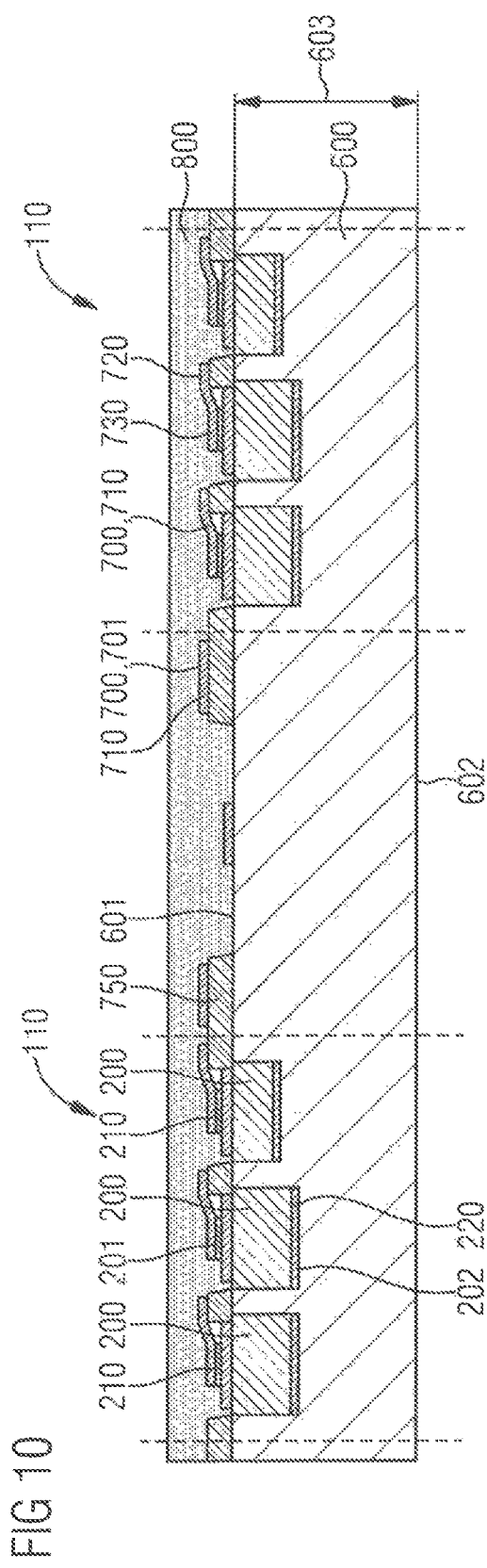
FIG. 10 shows a sectional side view of the molded body after a process of blackening the front-side metallization.

FIG. 10 shows a schematic sectional side view of the molded body 600 and of the light emitting diode chips 200 embedded therein, in a processing state temporally succeeding the illustration in FIG. 8.

The front-side metallization 700 has been blackened and now forms a blackened front-side metallization 701. Blackening the front-side metallization 700 may have been carried out, for example, by oxidizing the front-side metallization 700, for example, by means of an oxygen plasma. To that end, the front-side metallization 700 may comprise an Ag coating, for example.

In order to protect the blackened front-side metallization 701 against abrasion or other damage, a covering layer 800 has been arranged above the blackened front-side metallization 701. The covering layer 800 comprises the best possible optical transparency. The covering layer 800 may comprise a silicone, for example. The covering layer 800 may additionally also serve to protect the light emitting diode chips 200 against damage resulting from external influences.

The blackened front-side metallization 701 achieves a strong contrast between the light emitting top sides 201 of the light emitting diode chips 200 and the blackened front-side metallization 701. It is expedient if the blackened front-side metallization 701 covers the largest possible proportion of the front side 601 of the molded body 600. This holds true particularly in the case where the front side 601 of the molded body 600 is configured in a reflective fashion and/or with a bright color.

As an alternative to the blackening of the front-side metallization 700 as explained with reference to FIG. 10, it is possible to cover the front-side metallization 700 and/or the front side 601 of the molded body 600 with a light absorbing additional layer, for example, with a layer of a black soldering resist. It is likewise possible to dispense with the covering layer 800.

In a processing step succeeding the processing state illustrated in FIG. 10, the molded body 600 may be ground away at its rear side 602 in order to reduce the thickness 603 of the molded body 600. In this case, however, the thickness 603 of the molded body 600 generally remains greater than the thicknesses 203 of the light emitting diode chips 200. In order to grind away the molded body 600, it may be necessary to arrange the molded body 600 with its front side 601 on a hard carrier.

Figure 11:
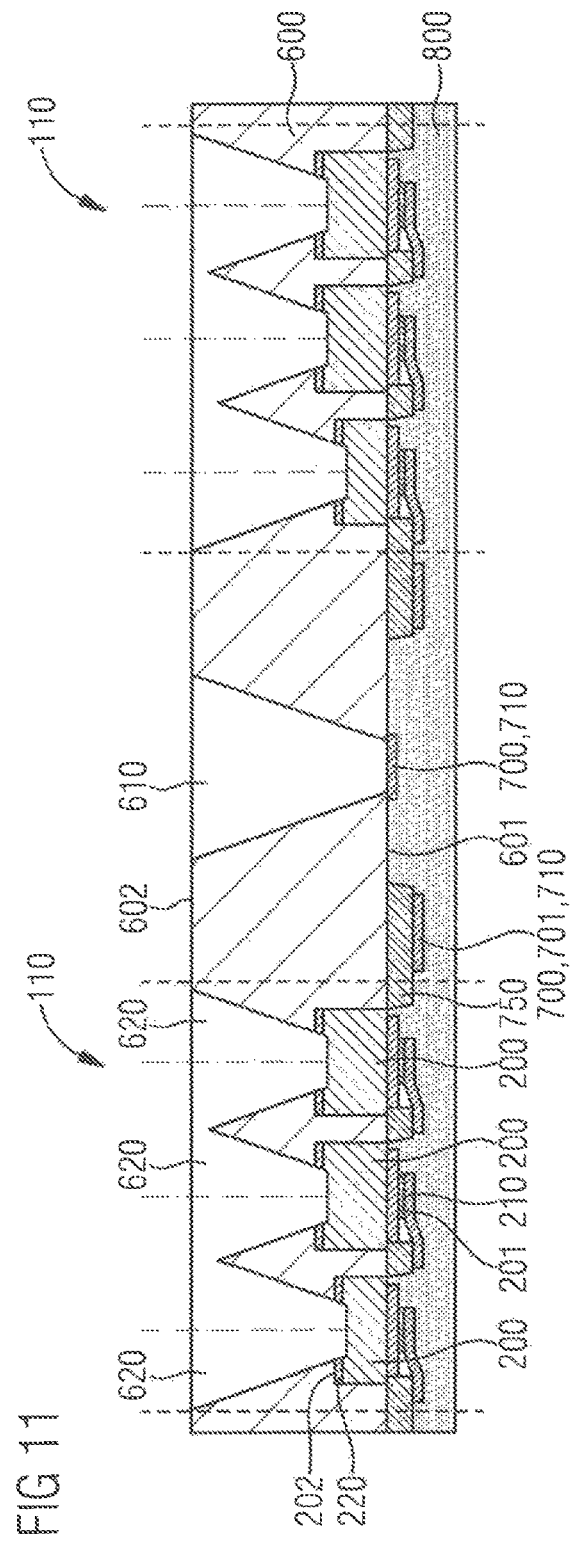
FIG. 11 shows a sectional side view of the molded body after a process of creating contact openings and openings for through contacts.

FIG. 11 shows a schematic sectional side view of the molded body 600, of the light emitting diode chips 200 embedded therein and of the front-side metallization 700, in a processing state temporally succeeding the illustration in FIG. 10.

Contact openings 620 have been created in the molded body 600, said contact openings extending from the rear side 602 of the molded body 600 as far as the bottom sides 202 of the light emitting diode chips 200 embedded into the molded body 600. In this case, one contact opening 620 per light emitting diode chip 200 has been created in the molded body 600.

Creating the contact openings 620 may have been carried out, for example, by means of a laser process, in particular, for example, by means of laser drilling. In this case, the drilling process may have been stopped after penetrating through the molded body 600, for each contact opening 620, at the metal of the bottom electrode 220 of the respective light emitting diode chip 200, said metal being arranged at the bottom side 202 of said light emitting diode chip 200, as is illustrated by way of example for the pixel 110 shown in the right-hand part of FIG. 11. Alternatively, however, the metal arranged at the bottom side 202 of the light emitting diode chip 200 may also have been penetrated during the drilling process, such that the contact opening 620 extends a little way into the light emitting diode chip 200 at the bottom side 202 of the light emitting diode chip 200. This is illustrated by way of example for the pixel 110 shown in the left-hand part of FIG. 11. In this case, after creating the contact openings 620 it may be necessary for the bottom sides 202 of the light emitting diode chips 200 to be incipiently etched in order to eliminate possible defects.

In addition to the contact openings 620, openings for through contacts 610 have been created in the molded body 600, these extending from the rear side 602 of the molded body 600 through the molded body 600 as far as the front-side metallization 700 arranged at the front side 601 of the molded body 600. The openings for the through contacts 610 may, for example, likewise have been created by means of laser drilling. In this case, the drilling process may have been stopped upon reaching the front-side metallization 700.

Figure 12:
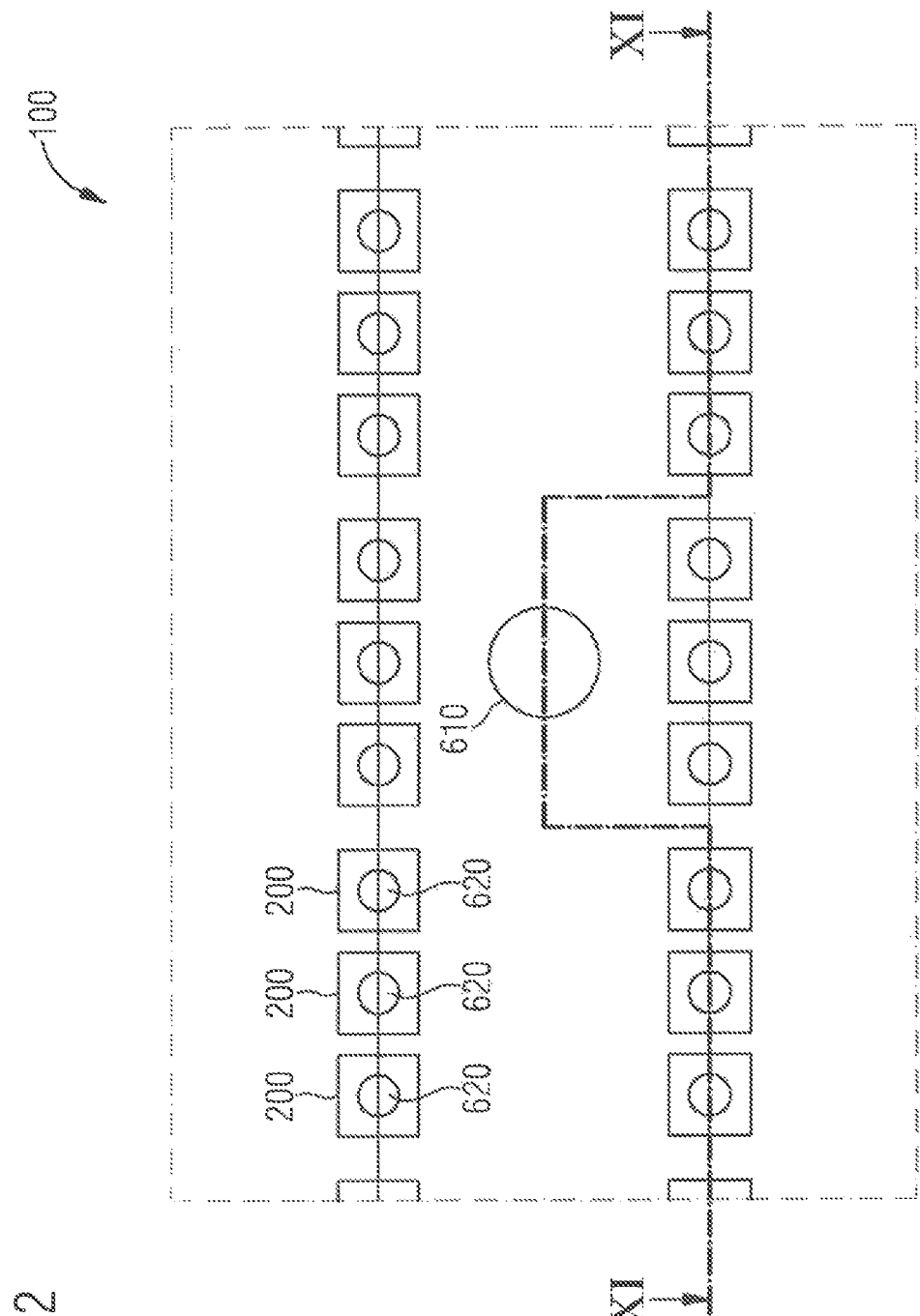
FIG. 12 shows a plan view of part of the molded body after the process of creating the contact openings and the openings for through contacts.

FIG. 12 shows an excerpt from the schematic illustration of the video wall module 100 from FIG. 1, which depicts the positions of some contact openings 620 created in the molded body 600 and of an opening for a through contact 610 created in the molded body 600.

Figure 13:
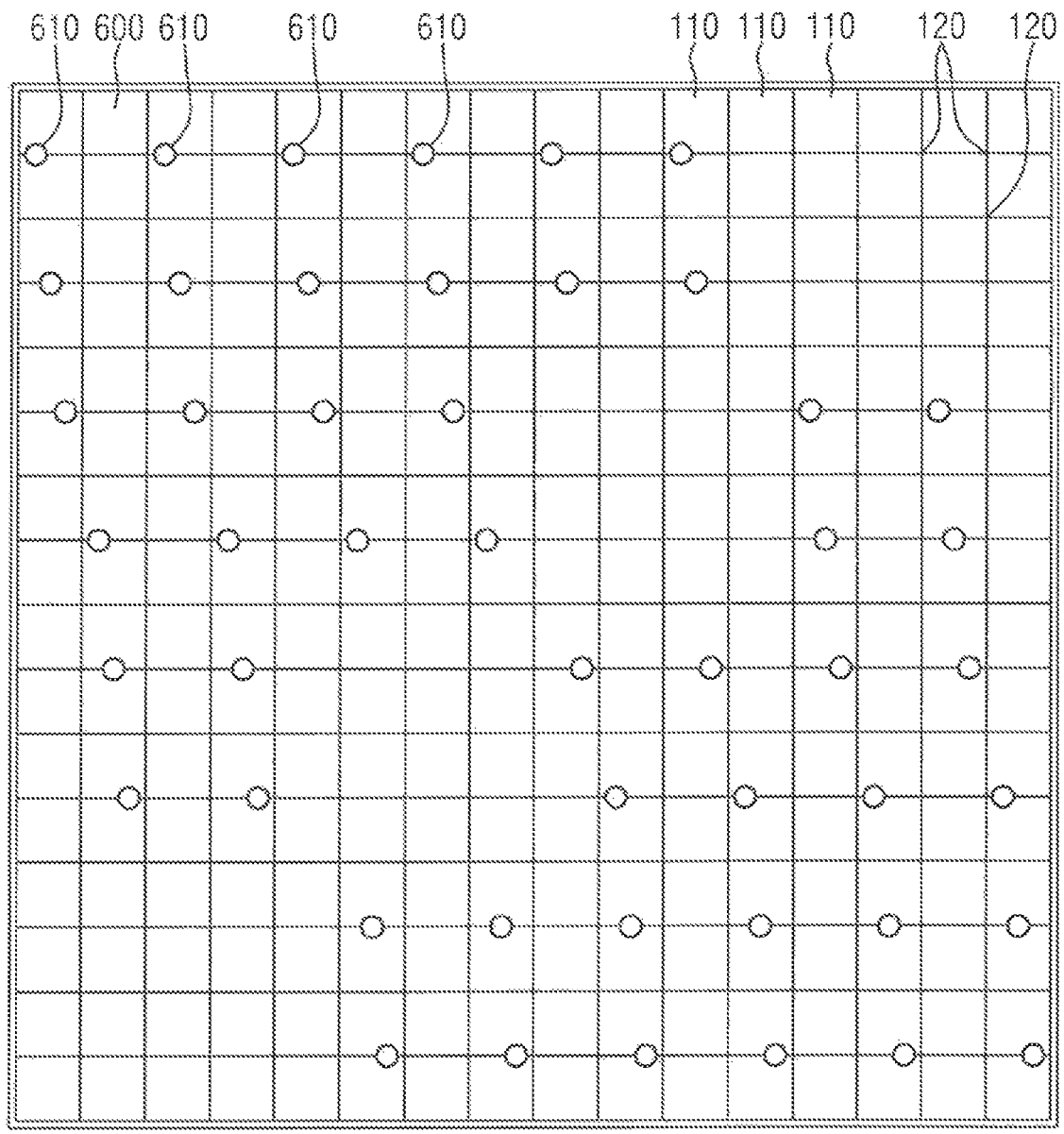
FIG. 13 shows an illustration of the positions of the through contacts.

FIG. 13 shows a schematic illustration of the pixel raster 120 of the video wall module 100. The positions of all the openings for through contacts 610 created in the molded body 600 are illustrated here. The openings for the through contacts 610 are distributed over the pixel raster 120 such that exactly one opening for a through contact 610 is arranged below each column line 710 of the front-side metallization 700.

FIG. 14 shows a schematic sectional side view of the molded body 600, of the light emitting diode chips 200 embedded into the molded body 600 and of the front-side metallization 700, in a processing state temporally succeeding the illustration in FIG. 10 in accordance with an alternative variant of the production method.

In the processing state shown in FIG. 14, instead of the contact openings 620, contact trenches 630 have been created in the molded body 600. FIG. 16 shows an excerpt from the schematic illustration of the video wall module 100 from FIG. 1, in which the course of two contact trenches 630 is discernible. The contact trenches 630 extend along the rows of the pixel raster 120. In this case, one contact trench 630 has been created per row of the pixel raster 120. FIG. 15 shows a schematically illustrated section through part of the molded body 600, said section being parallel to the direction of extent of a contact trench 630.

The contact trenches 630 extend in each case from the rear side 602 of the molded body 600 as far as the bottom sides 202 of the light emitting diode chips 200. The contact trenches 630 may have been created by means of a sawing process, for example. In this case, the bottom sides 202 of the light emitting diode chips 200 may likewise have been partly sawn. The saw blade used for creating the contact trenches 630 may comprise a V-shape, as is discernible from the sectional illustration in FIG. 15.

In addition to the contact trenches 630, openings for through contacts 610 have also been created in the variant of the production method as explained with reference to FIGS. 14 to 16. Said openings for through contacts have been created according to the same method and at the same positions as in the method explained with reference to FIGS. 11 to 13.

Both in the processing state illustrated schematically in FIG. 11 and in the processing state illustrated schematically in FIG. 14, the bottom electrodes 220 of the light emitting diode chips 200 embedded into the molded body 600 are at least partly no longer covered by the material of the molded body 600 and are externally accessible as a result. However, other sections of the bottom sides 202 of the light emitting diode chips 200 embedded into the molded body 600 may still be covered by material of the molded body 600.

The contact openings 620 and/or the contact trenches 630 may also be created by means of a plasma or a sandblasting process, as an alternative to the methods described.

Figure 17:
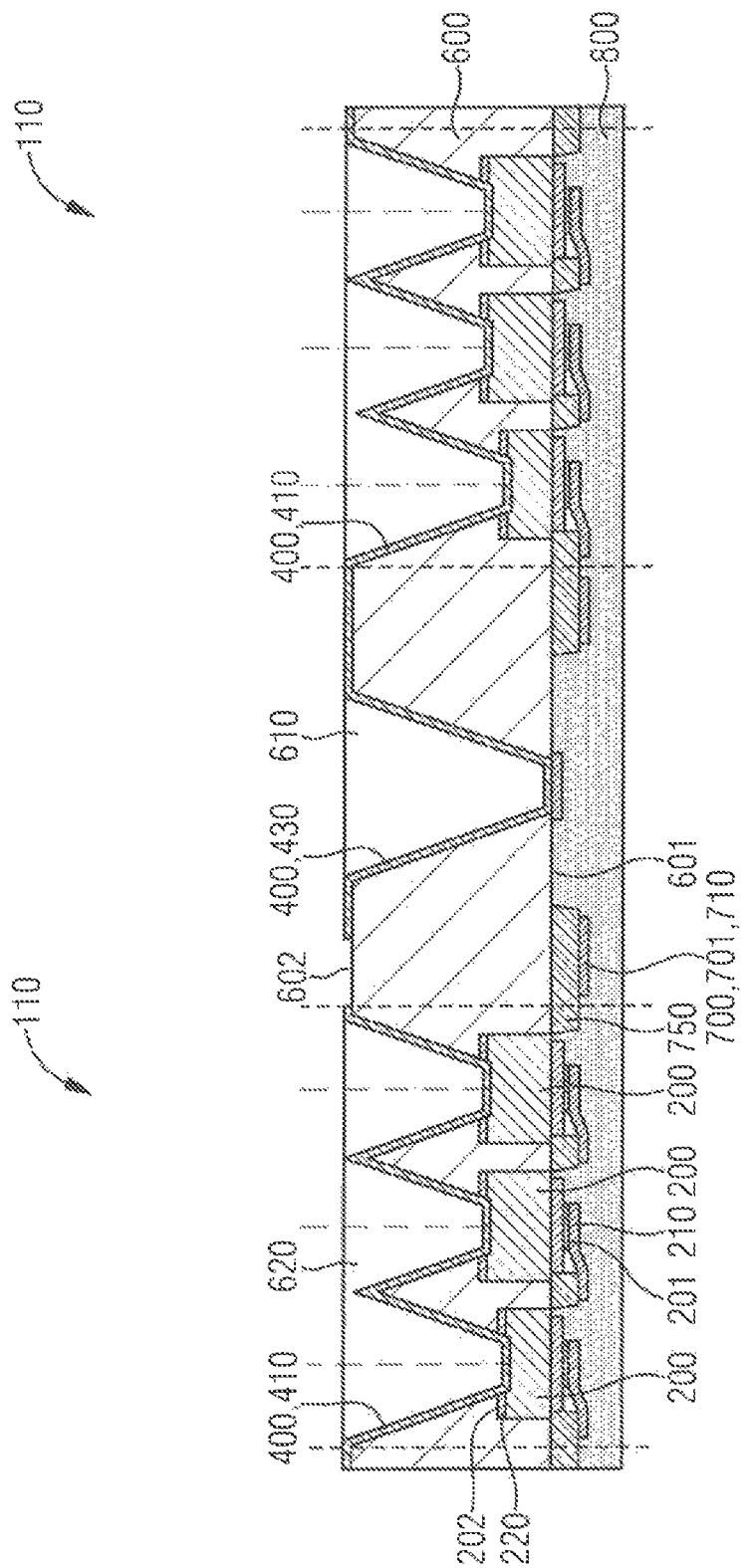
FIG. 17 shows a sectional side view of the molded body after a process of applying a rear-side metallization.

FIG. 17 shows a schematic sectional side view of the molded body 600 and of the light emitting diode chips 200 embedded therein, in a processing state temporally succeeding the illustration in FIG. 11. Alternatively, however, the processing state shown in FIG. 14 could also have been taken as a starting point.

A rear-side metallization 400 has been arranged at the rear side 602 of the molded body 600. Arranging the rear-side metallization may have been carried out, for example, by means of a process sequence comprising arranging a seed layer, a photographic technique, an electrolytic process step, removing a photoresist and etching the seed layer or alternatively a lift-off process. Alternatively, the process sequence may also comprise the use of a patterned seed layer.

FIG. 18 shows a plan view of the rear-side metallization 400 in a schematic illustration. Moreover, FIG. 18 illustrates the course of the sectional plane along which the illustration in FIG. 19, as described below, is cut.

The rear-side metallization 400 comprises a plurality of parallel strips forming the row lines 410 of the cross-matrix interconnection 130. The row lines 410 extend along the rows of the pixel raster 120. The individual row lines 410 are electrically insulated from one another.

The metal of the row lines 410 of the rear-side metallization 400 arranged at the rear side 602 of the molded body 600 extends into the contact openings 620 (or alternatively into the contact trenches 630) arranged in the molded body 600, such that each row line 410 is electrically conductively connected to the bottom electrodes 220 of the light emitting diode chips 200 of the respective row of the pixel raster 120.

The rear-side metallization 400 formed at the rear side 602 of the molded body 600 additionally comprises row terminal structures 420 and column terminal structures 430, which are arranged in each case between the row lines 410. The row terminal structures 420 are electrically conductively connected to the row lines 410. In this case, each row line 410 is connected to a row terminal structure 420 and each row terminal structure 420 is connected to a row line 410. The column terminal structures 430 are electrically insulated from one another, from the row lines 410 and from the row terminal structures 420.

In the regions of the column terminal structures 430, the metal of the rear-side metallization 400 extends into the openings provided for the through contacts 610 in the molded body 600 and thereby forms the through contacts 610. Each through contact 610 thus formed produces an electrically conductive connection between a column line 710 formed by the front-side metallization 700 and a column terminal structure 430 formed by the rear-side metallization 400.

It would be possible, as an alternative to the processes described with reference to FIGS. 11 to 16 for creating the openings provided for the through contacts 610 in the molded body 600 and arranging the metal of the rear-side metallization 400 in said openings, to create the through contacts 610 by embedding electrically conductive elements (via chips) into the molded body 600. For this purpose, the electrically conductive elements are arranged together with the light emitting diode chips 200 on the adhesive film 145 above the temporary carrier 140 and are embedded together with the light emitting diode chips 200 into the molded body 600.

FIG. 19 shows a schematic sectional side view of the molded body 600 in a processing state temporally succeeding the illustration in FIG. 17.

A molded layer 301 has been arranged at the rear side 602 of the molded body 600. The molded layer 301 covers the rear-side metallization arranged at the rear side 602 of the molded body 600 and may also fill the depressions of the contact openings 620 or contact trenches 630 and of the through contacts 610 that still remain after the process of applying the rear-side metallization 400. As a result, the molded layer 301 may bring about an additional mechanical stabilization of the molded body 600. This may be necessary, in particular, if continuous contact trenches 630 have been created in the molded body 600.

The molded layer 301 has been formed by means of a molding method, for example, by means of compression molding or by means of transfer molding. The molded layer 301 comprises an electrically insulating material. By way of example, the molded layer 301 may comprise the same material as the molded body 600.

After the process of applying the molded layer 301, openings for through contacts 310 have been created in the molded layer 301. The openings for the through contacts 310 extend from the side of the molded layer 301 facing away from the molded body 600 through the molded layer 301 as far as the rear-side metallization 400 arranged between the molded layer 301 and the molded body 600. Creating the openings for the through contacts 310 may have been carried out, for example, once again by means of a laser process, for example, by means of laser drilling.

FIG. 20 shows a schematic illustration of the pixel raster 120 of the video wall module 100. The positions of the openings for the through contacts 310 created in the molded layer 301 are depicted here. The openings for the through contacts 310 are arranged at nodes of the pixel raster 120 at which in each case two adjacent rows and two adjacent columns of the pixel raster 120 meet. 2×2 adjacent pixels 110 respectively form a group of associated pixels 110. The exemplary pixel raster 120 comprising 16×16 pixels 110 thus comprises 8×8 groups of this type. An opening for a through contact 310 is arranged at each node of the pixel raster at which four pixels 110 of a group of pixels 110 adjoin one another. Overall, 8×8 openings for through contacts 310 are thus provided in the molded layer 301 in the example illustrated.

A comparison of FIGS. 18 and 20 shows that each opening for a through contact 310 is arranged either above a row terminal structure 420 or a column terminal structure 430 of the rear-side metallization 400.

FIG. 21 shows a schematic sectional side view of the molded body 600 and of the molded layer 301 arranged at the rear side 602 of the molded body 600, in a processing state temporally succeeding the illustration in FIG. 19.

An elastomeric layer 302 has been arranged at the side of the molded layer 301 facing away from the molded body 600. The elastomeric layer 302 comprises an elastic material and may be provided for compensating for different thermal expansions of the molded body 600 and of the molded layer 301 of the video wall module 100, on the one hand, and of a carrier that carries the video wall module 100 on the other hand.

The elastomeric layer 302 likewise comprises an opening in the region of the opening for the through contact 310. This opening in the elastomeric layer 302 may have been created by means of a photopatterning method, for example. In this case, the elastomeric layer 302 may be formed from a photopatternable dielectric, for example. Alternatively, however, it is also possible to create the opening for the through contact 310 only after the process of arranging the elastomeric layer 302 on the molded layer 301, in a common work step simultaneously in the elastomeric layer 302 and the molded layer 301.

The molded layer 301 and the elastomeric layer 302 jointly form a dielectric layer 300. However, it is likewise possible to dispense with the process of arranging the elastomeric layer 302. In this case, the molded layer 301 by itself forms the dielectric layer 300.

FIG. 22 shows a schematic sectional side view of the molded body 600 in a processing state temporally succeeding the illustration in FIG. 17, this processing state resulting from further processing steps that may be carried out as an alternative to the method steps described with reference to FIGS. 19 to 21.

The elastomeric layer 302 has been arranged directly at the rear side 602 of the molded body 600, said elastomeric layer thus by itself forming the dielectric layer 300. The provision of the molded layer 301 has been dispensed with. The elastomeric layer 302 may have been configured in a manner such as has been described with reference to FIG. 21.

Once again the openings for the through contacts 310 have likewise been created in the elastomeric layer 302 forming the dielectric layer 300. Creating the openings for the through contacts 310 may have been carried out by means of a photopatterning method or, for example, by means of a drilling process.

FIG. 23 shows a schematic sectional side view of the molded body 600 and of the dielectric layer 300 arranged at the rear side 602 of the molded body 600, in a processing state temporally succeeding the illustration in FIG. 19. It goes without saying, however, that the processing could also have been continued proceeding from the processing state shown in FIG. 21 or from the processing state shown in FIG. 22.

An outer metallization 500 has been arranged at the side of the dielectric layer 300 facing away from the molded body 600. FIG. 24 shows a schematic plan view of the outer metallization 500 arranged at the dielectric layer 300.

The outer metallization 500 comprises a plurality of contact pads 510. In the example illustrated, the outer metallization 500 comprises 8×8 contact pads 510. In this case, like the openings for the through contacts 310, the contact pads 510 are arranged at the nodes of the pixel raster 120 at which in each case the four pixels 110 of an associated group of pixels 110 adjoin one another.

In the region of each contact pad 510 of the outer metallization 500, the metal of the outer metallization 500 extends into the opening arranged for the through contact 310 in the dielectric layer 300 and thus respectively forms a through contact 310. Each of these through contacts 310 produces an electrically conductive connection between a contact pad 510 of the outer metallization 500 and either a row terminal structure 420 or a column terminal structure 430 of the rear-side metallization 400.

Consequently, each row line 410 of the rear-side metallization 400 is electrically conductively connected to a contact pad 510 of the outer metallization 500 via a row terminal structure 420 and a through contact 310 arranged in the dielectric layer 300. Moreover, each column line 710 of the front-side metallization 700 is also electrically conductively connected to a contact pad 510 of the outer metallization 500 via a through contact 610 arranged in the molded body 600, a column terminal structure 430 provided in the rear-side metallization 400, and a through contact 310 arranged in the dielectric layer 300. Consequently, the contact pads 510 of the outer metallization 500 allow an electrical contacting of the top electrodes 210 and of the bottom electrodes 220 of all the light emitting diode chips 200 embedded into the molded body 600.

Figure 25:
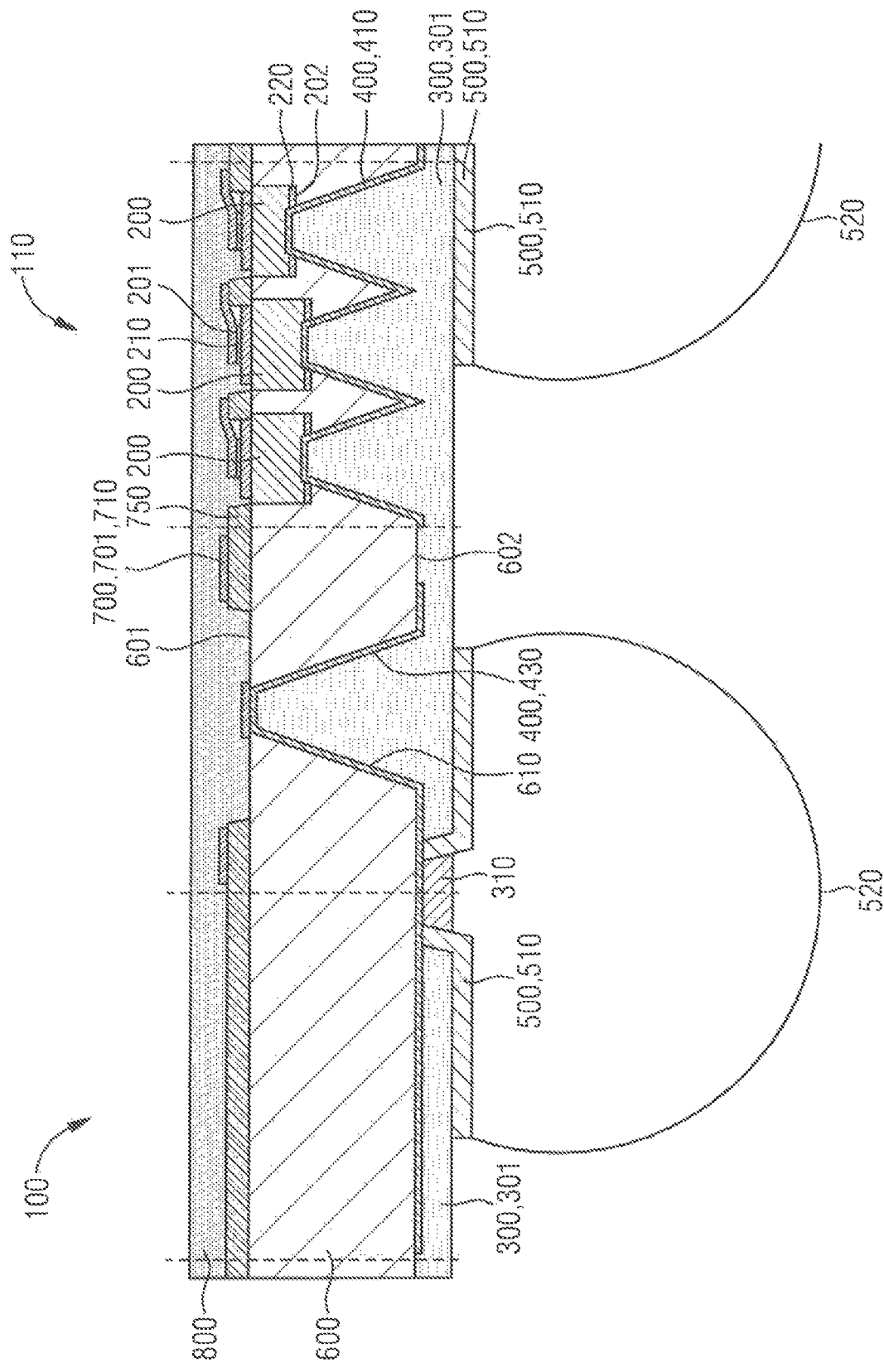
FIG. 25 shows a sectional side view of part of a finished video wall module.

FIG. 25 shows a schematic sectional side view of part of the video wall module 100 after the conclusion of production. The processing state shown in FIG. 25 temporally succeeds the processing state shown in FIG. 23.

Solder balls 520 have been arranged at the contact pads 510 formed by the outer metallization 500. The video wall module 100 thus forms a ball grid array component which is suitable as an SMD component for surface mounting. Alternatively, however, the process of arranging the solder balls 520 may also be dispensed with.

It is possible to produce the video wall module together with a plurality of further video wall modules 100 in a component assemblage and to singulate it by separation only after the conclusion of the common processing steps.

The invention has been illustrated and described in greater detail on the basis of the preferred exemplary embodiments. Nevertheless, the invention is not restricted to the examples disclosed. Rather, other variations may be derived therefrom by the person skilled in the art, without departing from the scope of protection of the invention.

The invention claimed is:

1. A video wall module comprising:
    a plurality of light emitting diode chips logically distributed among rows and columns of a matrix, the matrix having a plurality of rows and columns, each light emitting diode chip comprising a top electrode arranged at a top side of the light emitting diode chip and a bottom electrode arranged at a bottom side of the light emitting diode chip;
    a molded body embedding the light emitting diode chips;
    a front-side metallization arranged at a front side of the molded body, wherein the top electrodes are connected to the front-side metallization, and wherein the top electrodes are electrically connected to one another column-by-column by the front-side metallization;
    a rear-side metallization arranged at a rear side of the molded body, wherein the bottom electrodes are connected to the rear-side metallization, wherein the bottom electrodes are electrically connected to one another row-by-row by the rear-side metallization;
    a dielectric layer arranged at the rear side of the molded body; and
    an outer metallization arranged at the dielectric layer, wherein the rear-side metallization is electrically conductively connected to the outer metallization.

2. The video wall module according to claim 1, wherein two or three adjacent light emitting diode chips of a row represent one pixel, and wherein the plurality of light emitting diodes represent a plurality of pixels.

3. The video wall module according to claim 2, wherein the pixels are arranged in a rectangular grid.

4. The video wall module according to claim 2, wherein the light emitting diode chips of a pixel are arranged linearly alongside one another.

5. The video wall module according to claim 1, wherein the top sides of the light emitting diode chips are not covered by the molded body.

6. The video wall module according to claim 1,
    wherein the bottom sides of the light emitting diode chips are at least partly covered by the molded body, and
    wherein the bottom electrodes are at least partly not covered by the molded body.

7. The video wall module according to claim 1, wherein the molded body comprises a greater thickness than the light emitting diode chips.

8. The video wall module according to claim 1, wherein electrically conductive through contacts are arranged in the molded body, and wherein the through contacts provide electrically conductive connections between the front-side metallization and the rear-side metallization.

9. The video wall module according to claim 1, wherein electrically conductive through contacts are arranged in the dielectric layer, and wherein the through contacts provide electrically conductive connections between the rear-side metallization and the outer metallization.

10. The video wall module according to claim 1, wherein the front-side metallization is covered at least in sections by a light absorbing layer.

11. A method for producing a video wall module, the method comprising:
    embedding a plurality of light emitting diode chips into a molded body, each light emitting diode chip comprising a top electrode arranged at a top side of the light emitting diode chip and a bottom electrode arranged at a bottom side of the light emitting diode chip, wherein the light emitting diode chips are logically distributed among rows and columns of a matrix, the matrix having a plurality of rows and columns;
    arranging a front-side metallization at a front side of the molded body, wherein the front-side metallization is connected to the top electrodes, and wherein the top electrodes are electrically connected to one another column-by-column by the front-side metallization;
    arranging a rear-side metallization at a rear side of the molded body, wherein the rear-side metallization is connected to the bottom electrodes, and wherein the bottom electrodes are electrically connected to one another row-by-row by the rear-side metallization;
    arranging a dielectric layer at the rear side of the molded body; and
    arranging an outer metallization at the dielectric layer.

12. The method according to claim 11, further comprising, before arranging the front-side metallization, arranging an edge-insulating layer on edges of the top sides of the light emitting diode chips.

13. The method according to claim 11, further comprising, before arranging the rear-side metallization, exposing the bottom electrodes by a laser process, a plasma process, a sandblasting process or a grinding separation process.

14. The method according to claim 11, further comprising arranging electrically conductive through contacts in the molded body, the through contacts providing electrically conductive connections between the front-side metallization and the rear-side metallization.

15. The method according to claim 11, further comprising arranging electrically conductive through contacts in the dielectric layer, the through contacts providing electrically conductive connections between the rear-side metallization and the outer metallization.

16. The method according to claim 11, wherein arranging the dielectric layer comprises arranging the dielectric layer using a molding method.

17. The method according to claim 11, wherein arranging the dielectric layer comprises arranging the dielectric layer using a photolithographic method.

18. The method according to claim 11, further comprising oxidizing the front-side metallization.

19. The method according to claim 11, further comprising applying a light absorbing layer on the front-side metallization.

* * * * *